US012757700B2

(12) United States Patent
Peng et al.

(10) Patent No.: US 12,757,700 B2
(45) Date of Patent: Oct. 6, 2026

(54) AREA SELECTIVE DEPOSITION FOR ZERO VIA ENCLOSURE AND EXTREMELY SMALL METAL LINE END SPACE

(71) Applicant: TAIWAN SEMICONDUCTOR MANUFACTURING COMPANY, LTD., Hsinchu (TW)

(72) Inventors: Shih-Wei Peng, Hsinchu (TW); Chih-Min Hsiao, Hsinchu (TW); Chien-Wen Lai, Hsinchu (TW); Jiann-Tyng Tzeng, Hsinchu (TW); Yu-Luen Deng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 965 days.

(21) Appl. No.: 17/832,205

(22) Filed: Jun. 3, 2022

(65) Prior Publication Data

US 2023/0282514 A1 Sep. 7, 2023

Related U.S. Application Data

(60) Provisional application No. 63/316,721, filed on Mar. 4, 2022.

(51) Int. Cl.

*H10W 20/00* (2026.01)
*H10W 20/43* (2026.01)
*H10W 70/60* (2026.01)
*H10W 70/65* (2026.01)

(52) U.S. Cl.

CPC ......... *H10W 20/057* (2026.01); *H10W 20/43* (2026.01)

(58) Field of Classification Search

CPC ......... H01L 21/76879; H01L 21/76897; H01L 21/76816; H01L 21/76825

See application file for complete search history.

(56) References Cited

U.S. PATENT DOCUMENTS 7,348,281 B2 * 3/2008 Brakensiek ......... H10W 20/085 257/E21.255
9,224,744 B1 * 12/2015 Yokota .............. H01L 21/32139
2009/0206489 A1 * 8/2009 Li ........................... H10P 50/73 257/E21.295

(Continued)

FOREIGN PATENT DOCUMENTS

CN 103996652 8/2014
CN 113192880 7/2021

*Primary Examiner* — Nicholas J Tobergte
*Assistant Examiner* — Moataz Khalifa
(74) *Attorney, Agent, or Firm* — Hauptman Ham, LLP

(57) ABSTRACT

Provided is a method for manufacturing integrated circuit (IC) devices including the operations of forming a first metal pattern (Mx) on a semiconductor substrate, forming a first via pattern (Vx) on the first metal pattern using an area selective deposition (ASD) that includes first and second vias formed adjacent opposed edges or terminal portions of the first metal pattern, and forming a second metal pattern (Mx+1) on the first via pattern with substantially no pattern overlap to form a zero enclosure and wherein a pair of adjacent vias are separated by a distance corresponding to the smallest end-to-end metal pattern spacing permitted under a set of design rules applied during the design of the IC devices.

20 Claims, 25 Drawing Sheets

(56) References Cited

U.S. PATENT DOCUMENTS

| | | | | |
|---|---|---|---|---|
| 2014/0231998 | A1* | 8/2014 | Kuo | H10W 20/075<br>257/751 |
| 2019/0157149 | A1* | 5/2019 | Tapily | H01L 21/02214 |
| 2019/0259613 | A1* | 8/2019 | Huang | H10D 84/0149 |
| 2020/0365451 | A1* | 11/2020 | Tien | H10W 20/085 |
| 2021/0020761 | A1* | 1/2021 | Tsai | H10D 84/038 |
| 2021/0296169 | A1* | 9/2021 | Philip | H01L 21/76816 |
| 2022/0130721 | A1* | 4/2022 | Bouche | H01L 21/76844 |
| 2022/0344205 | A1* | 10/2022 | Iwashita | H10W 20/057 |
| 2023/0129594 | A1* | 4/2023 | Sharangpani | H10W 20/057<br>257/774 |
| 2023/0268267 | A1* | 8/2023 | Cheng | H01L 23/5252<br>257/774 |

* cited by examiner

AREA SELECTIVE DEPOSITION FOR ZERO VIA ENCLOSURE AND EXTREMELY SMALL METAL LINE END SPACE

PRIORITY CLAIM

The present application claims the priority of U.S. Provisional Application No. 63/316,721, filed Mar. 4, 2022, which is incorporated herein by reference in its entirety.

BACKGROUND

Semiconductor devices are used in a variety of electronic applications, such as personal computers, cell phones, digital cameras, and other electronic equipment. Semiconductor devices are fabricated by sequentially depositing insulating or dielectric layers, conductive layers, and semiconductor layers of material over a substrate, and patterning the various material layers using lithography to form circuit components and elements thereon. As the semiconductor industry has progressed into nanometer technology process nodes in pursuit of higher device density, higher performance, and lower costs, challenges from both fabrication and design issues have resulted in the development of a number of three-dimensional designs including, for example, Metal-Oxide-Silicon Field Effect Transistors (MOS-FET), Field Effect Transistors (FET), Fin Field Effect Transistor (FinFET), and Gate-All-Around (GAA) devices.

Integrated circuit (IC) manufacturing is typically divided into front-end-of-line (FEOL) processing and back-end-of-line (BEOL) processing. FEOL processes generally encompass those processes related to fabricating functional elements, such as transistors and resistors, in or on a semiconductor substrate. For example, FEOL processes typically include forming isolation features, gate structures, and source and drain features (also referred to as source/drain or S/D features). BEOL processes generally encompass those processes related to fabricating a multilayer interconnect (MLI) feature that interconnects the functional IC elements and structures fabricated during FEOL processing to provide connection to and enable operation of the resulting IC devices.

BRIEF DESCRIPTION OF THE DRAWINGS

Aspects of the present disclosure are best understood from the following detailed description when read with the accompanying Figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
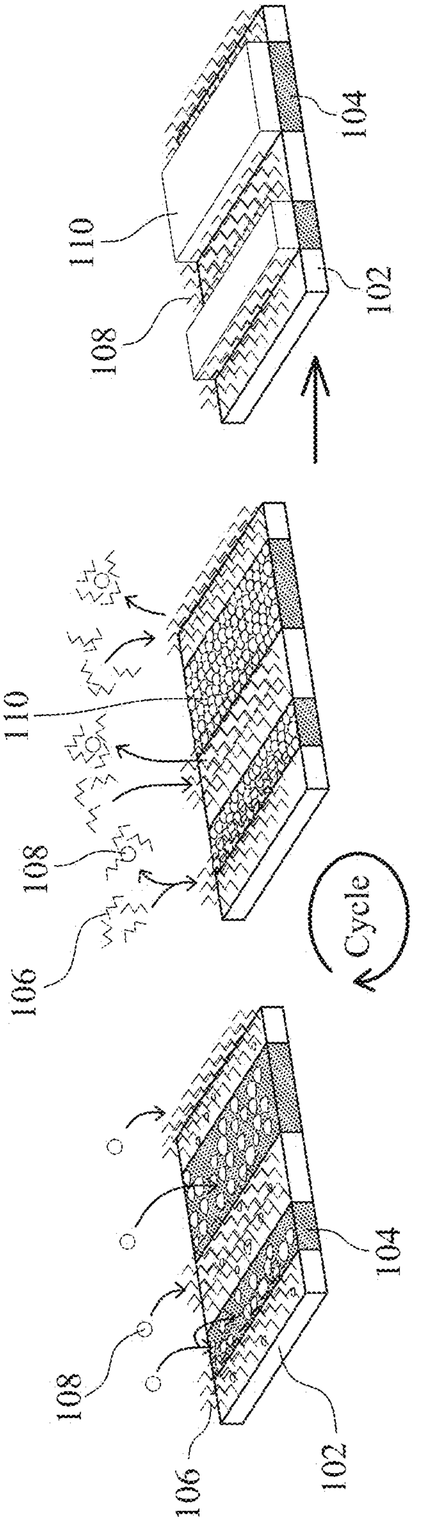
FIG. 1A is an orthographic view of an area selective deposition (ASD) useful in the manufacture of FET devices according to some embodiments.

This description of the exemplary embodiments is intended to be read in connection with the accompanying drawings, which are to be considered part of the entire written description. The following disclosure provides many different embodiments, or examples, for implementing different features of the provided subject matter. The drawings are not to scale, and the relative sizing and placement of structures have been modified for clarity rather than dimensional accuracy. Specific examples of components, values, operations, materials, arrangements, or the like, are described below to simplify the present disclosure.

These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper,” “vertical,” “horizontal,” and the like, may be used herein for ease of description to describe one element or feature’s relationship to another element(s) or feature(s) as illustrated in the Figures. The spatially relative terms are intended to encompass different orientations of the device in use or operation in addition to the orientation depicted in the Figures. The apparatus and structures may be otherwise oriented (rotated by, for example, 90°, 180°, or mirrored about a horizontal or vertical axis) and the spatially relative descriptors used herein may likewise be interpreted accordingly.

The structures and methods detailed below relate generally to the structures, designs, and manufacturing methods for IC devices include a multilevel interconnect (MLI) structure that allows for reduced spacing between conductive elements including, for example, contacts, a plurality of conductive metal patterns, and vias providing conductive connections between adjacent conductive metal patterns. Although the structures and methods will be discussed in terms of field effect transistor (FET) devices, the structures and methods are not so limited and are suitable for inclusion in manufacturing processes for other classes and configurations of IC devices including, without limitation, bulk semiconductor devices and silicon-on-insulator (SOI) devices, Metal-Oxide-Silicon Field Effect Transistors (MOS-FET) devices, Fin Field Effect Transistor (FinFET) devices, and Gate-All-Around (GAA) devices.

As IC technologies progress towards smaller technology nodes, BEOL processes are experiencing significant challenges. For example, advanced IC technology nodes incorporate more compact MLI features which, in turn, reduces the critical dimensions of interconnects of the MLI features (for example, widths, spacings, and/or heights of vias and/or conductive lines of the interconnection pattern layers). The reduced critical dimensions tend to increase interconnect resistance, which will tend to degrade IC device performance (e.g., by increasing resistance-capacitance (RC) delay), increase the risk of electromigration, and increase the risk of shorts between adjacent conductive elements. Accordingly, the various manufacturing processes used for forming MLI conductive patterns having reduced line widths and reduced line-to-line and/or end-to-end spacing becomes more challenging.

As feature areas continue to shrink, the physical alignment of successive layers and elements and maintaining the electrical isolation of separate elements represents significant challenges. Area-selective deposition (ASD) operations (or processes) provide a way for producing IC devices exhibiting increased metal and via structure densities that are achieved during back-end-of-line (BEOL) processing while simultaneously eliminating one or more photolithography operations and/or etching processes, which reduces manufacturing time, manufacturing cost, and manufacturing error. In some embodiments, an ASD operation provides the selective deposition of one or more conductive material(s) on the exposed conductive material surfaces, e.g., the terminal portions of adjacent conductive lines, contacts, vias, or other conductive elements or materials, while simultaneously suppressing or eliminating deposition of the conductive material(s) on the exposed surface of the dielectric material(s) that separate and electrically isolate the adjacent conductive structures or elements. In some embodiments, an ASD operation provides the selective deposition of one or more insulating material(s) on the exposed insulating surfaces, e.g., exposed portions of dielectric materials (including interlayer dielectric (ILD) and intermetal dielectric (IMD) layers) located between portions of adjacent conductive lines, while simultaneously suppressing or eliminating deposition of the insulating material(s) on the exposed surface of the conductive material(s). In some embodiments, ASD operations are used in different operations to provide the selective deposition of one or more conductive material(s) on the exposed metal surfaces and to provide the selective deposition of one or more insulating material(s) on the exposed dielectric surfaces. The ASD operations provide advantages over non-area selective metal deposition processes (e.g., blanket metal depositions) by confining the metal growth to certain target regions, thereby avoiding the need to remove the unwanted metal and risk of misalignment in the metal etch pattern and/or etch damage or particulate contamination that associated with the non-selective metal deposition based metal processes.

The ASD operations allows the via structures to be positioned on the terminal portions of the conductive lines, i.e., at a zero-offset position relative to the end of the conductive lines, thereby providing increased flexibility for via spacing that corresponding to the same end-to-end (E2E) spacing rules applied to adjacent and coaxial and/or parallel conductive lines. The E2E spacing rules are design specifications to account for inherent errors during manufacturing of semiconductor devices in order to reliably produce a functioning semiconductor device. The zero-offset positioning of the via structures also allows for decreased spacing between the edges of adjacent parallel conductive lines to achieve the same E2E spacing. The ability to manufacture and maintain reduced via structure spacing also provides for increased via/metal density because successive metal patterns are not required to correspond to via patterns that reflect non-zero process tolerance offsets (i.e., a portion of the underlying metal pattern is no longer designed to extend beyond the end of the via) from the E2E spacing utilized in earlier manufacturing processes.

As feature areas shrink to less than 100 nm, the physical alignment and overlay of multiple features and line edges become more challenging. The use of ASD operations provides improved alignment and overlay for nanoscale patterning, thereby providing for improved via and metal pattern densities in the MLI structures with reduced edge placement error (EPE). In some embodiments, this improved via and metal pattern densities results in IC devices having similar functionality, decreased chip area, and improved performance in comparison with other approaches. In some embodiments, simulations indicate that the IC devices manufactured in this manner exhibit at least 4% area gain in block level, meaning that the same IC device is able to be manufactured 4% smaller than other approaches.

In some embodiments, the ASD operation also eliminates processing operations associated with a via patterning operation, a via etch operation, and a via metal deposition operation, thereby reducing the risk of introduction of defects associated with such operations and will tend to increase manufacturing yield and lifetime performance of the IC device. In some embodiments, a via patterning operation is included, but the ASD operation allows for increased dimensional tolerances within the pattern, e.g., terminal portions of adjacent conductive and coaxial lines are exposed in a single opening, thereby decreasing the likelihood of patterning defects by allowing for a larger opening and increased tolerance for placement of the opening relative to underlying conductive pattern layers. In some embodiments, ASD operations are used on multiple levels of vias and metal patterns, thereby eliminating additional patterning operations and reducing the manufacturing steps for producing a functional integrated circuit (IC) device.

In some embodiments, the ASD operation is a combination of a self-assembled monolayer (SAM) passivation operation applied to the non-growth regions of the IC device coupled with an atomic layer deposition (ALD) operation applied to the growth regions of the IC device. This combination and sequence SAM and ALD operations are then repeated for a number of cycles sufficient to deposit a target thickness of material on the growth regions.

In some embodiments, the ASD operation also integrates a thermal atomic layer etching (ALE) operation for removing unwanted nuclei (e.g., metal, or other conductive atoms, or conductive compounds) from the non-growth regions of the IC device before the growth cycle of the ALD process commences. In this manner, the deposition of conductive material(s) on the non-growth region, e.g., the dielectric surface between the end of two coaxial conductive lines, is able to be suppressed or eliminated while during the same operation successive layers of the conductive materials are deposited on the adjacent terminal portions of the conductive lines to form the desired conductive structures, e.g., zero-offset via structures.

As detailed above, in some embodiments, the ASD operation comprises a metal-on-metal (MoM) operation in which successive cycles of the ASD operation deposit a series of layers of metal (or other conductive material(s)) on exposed metal surfaces, e.g., depositing via structures on the terminal portions of conductive lines, while avoiding deposition of the metal or other conductive materials on adjacent dielectric surfaces. In some embodiments, the ASD operation comprises a dielectric-on-dielectric (DoD) operation in which successive cycles of the ASD operation deposit a series of layers of dielectric material(s) on exposed dielectric surfaces, e.g., depositing dielectric material on the exposed surface of a dielectric material separating the terminal portions of adjacent conductive lines, while simultaneously avoiding deposition of the dielectric material(s) on the exposed terminal portions of the conductive lines.

FIG. 1A is an orthographic view of an area selective deposition (ASD) operation useful in the manufacture of IC devices according to some embodiments. The IC device in FIG. 1A includes regions of an insulating/dielectric material 102 that separate adjacent regions of a conductive material 104. During a deposition cycle, regions of a passivation material 106 are selectively formed over the dielectric material 102, the non-growth regions of the substrate, as a self-assembled monolayer (SAM). An atomic layer deposition (ALD) operation is then used to deposit conductive material 108 over the conductive material 104 regions of the substrate, the growth regions of the substrate, and the adjacent non-growth regions of the substrate. The regions of passivation material 106 are then removed from the surface of the substrate along with the conductive material 108 that was deposited in the non-growth regions of the substrate. The substrate is then cleaned for another cycle of passivation material 106 formation followed by another conductive material 108 deposition. This cycle of operations is then repeated to form a conductive structure 110 having a thickness within a target thickness range before the passivation material 106 is removed (not shown) and the substrate advances to the next stage of the IC manufacturing flow.

Figure 1B:
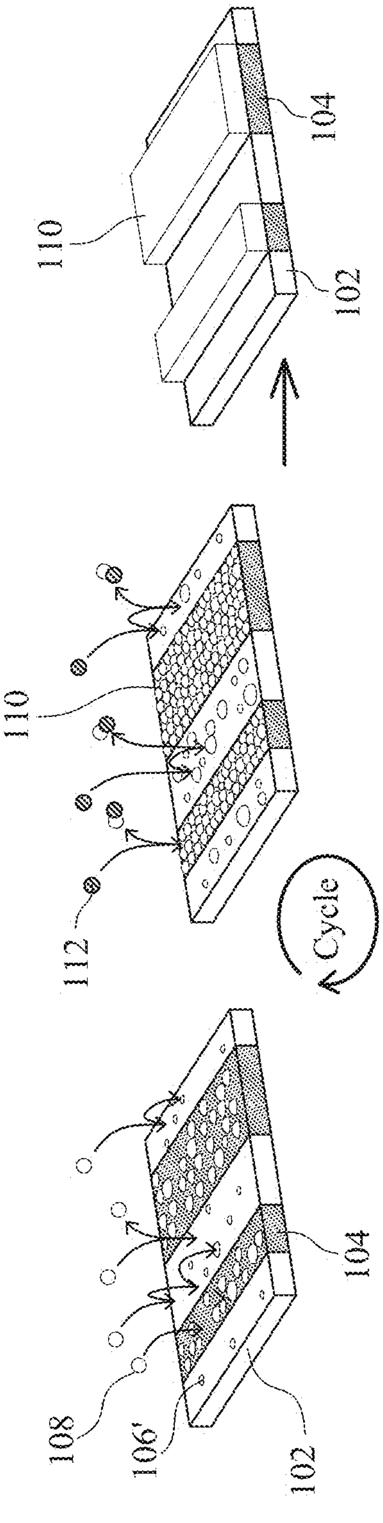
FIG. 1B is an orthographic view of an area selective deposition (ASD) useful in the manufacture of FET devices according to some embodiments.

FIG. 1B is an orthographic view of an area selective deposition (ASD) useful in the manufacture of IC devices according to some embodiments. The IC device in FIG. 1B includes regions of an insulating/dielectric material 102 that separate adjacent regions of a conductive material 104. An atomic layer deposition (ALD) operation is used to deposit conductive material 108 over both the growth and non-growth regions of the substrate. The conductive materials deposited on the non-growth regions of dielectric material 102 are then selectively removed from the surface of the substrate using, for example, a thermal atomic layer etching (ALE) operation using an etch species 112. The substrate is then cleaned for another cycle of conductive material 108 deposition and an ALE operation to remove the conductive material from the non-growth regions of the substrate. This cycle of operations is then repeated to form a conductive structure 110 having a thickness within a target thickness range before the substrate advances to the next stage of the IC manufacturing flow.

Figure 2A:
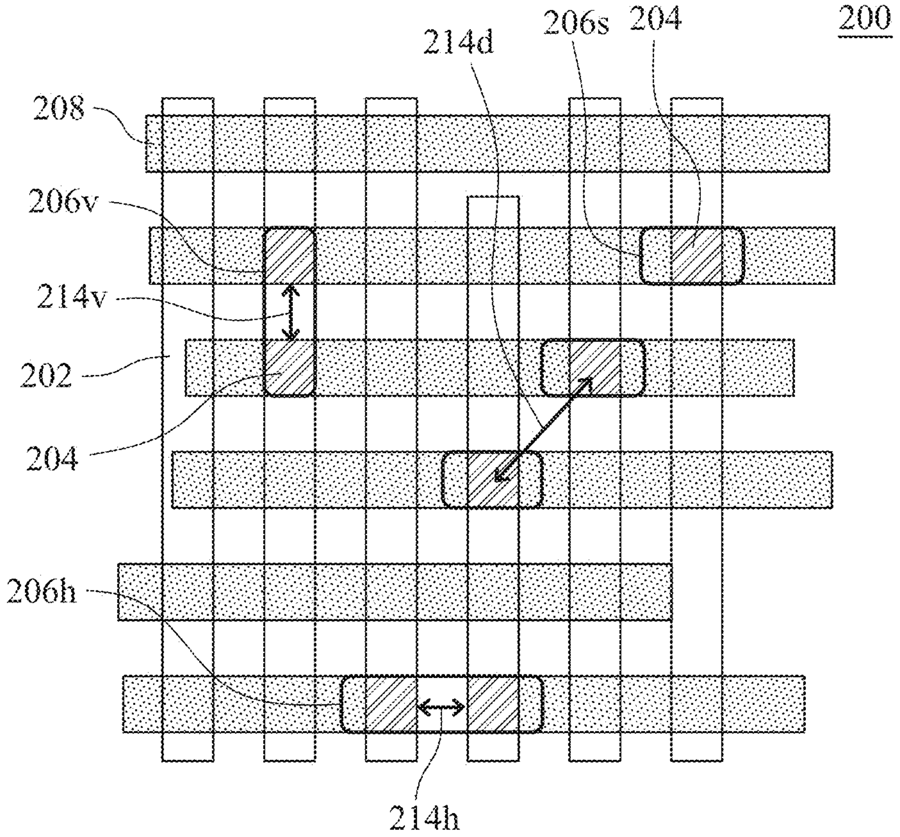
FIG. 2A is a plan view of MLI structures for IC devices according to some embodiments.

FIG. 2A is a plan view of MLI structures for IC devices 200 according to some embodiments. The IC device in FIG. 2A includes a first conductive pattern including a series of parallel conductive lines forming a Mx metal pattern 202 aligned in a first direction. A series, array, or pattern of vias 204 is arranged over the first conductive pattern and includes vias formed in various via pattern openings. In some embodiments, the via pattern includes vertical via pattern openings 206*v* that provide for the simultaneous formation of a pair of vias on adjacent ends of first and second conductive pattern elements in the Mx metal pattern 202 with the two vias being separated by a vertical spacing 214*v*. In some embodiments, the via pattern includes single via pattern openings 206*s* that provide for the formation of single vias at various locations above the Mx metal pattern with adjacent single vias having a diagonal via spacing 214*d*. In some embodiments, the via pattern includes horizontal via pattern openings 206*h* that provide for the formation of a pair of vias on adjacent first and second parallel conductive pattern elements in the Mx metal pattern with the two vias being separated by a horizontal spacing 214*h* that corresponds to the end-to-end (E2E) spacing of the separate conductive pattern elements in the Mx metal pattern. The IC device in FIG. 2A includes a second conductive pattern including a series of parallel conductive lines forming a Mx+1 metal pattern 208 that are aligned in a second direction. The Mx metal pattern 202 is electrically connected to the Mx+1 metal pattern 208 through the vias 204. In some embodiments, the second direction is perpendicular to the first direction.

Figure 2B:
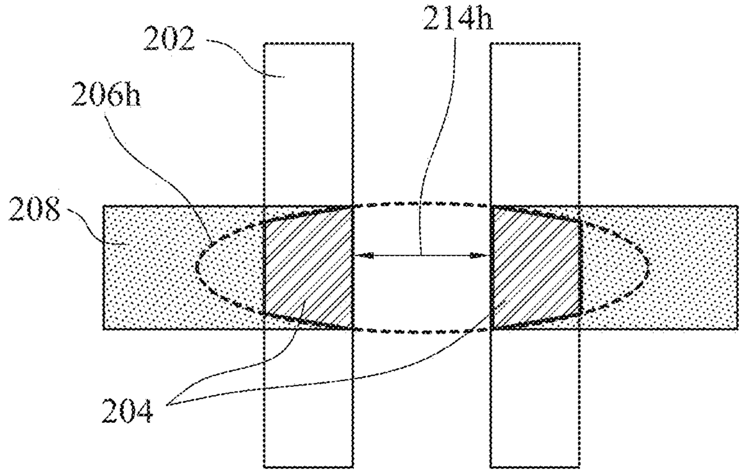
FIG. 2B is a plan view of MLI structures for IC devices adjacent a horizontal via pattern opening according to some embodiments.

FIG. 2B is a plan view of MLI structures for IC devices adjacent a horizontal via pattern opening 206*h* according to some embodiments. In comparison with FIG. 2A, FIG. 2B includes additional detail of the Mx metal pattern 202, the Mx+1 metal pattern 208, the vias 204 which extend between the Mx and Mx+1 metal patterns, and the via pattern opening 206*h* that provides for the simultaneous formation of the vias 204, in accordance with some embodiments. FIG. 2B includes a via pattern opening 206*h* that departs from a more idealized rectangular configuration to reflect a more oval opening closely corresponding to the actual the opening configurations achieved with the photolithographic processes utilized in some embodiments. The ASD operations used to form the vias 204 limit the deposition of the via material(s) to the exposed portions of the Mx metal pattern 202 and result in a generally trapezoidal edge configuration or perimeter profile exhibited by the resulting vias 204, separated by a horizontal spacing 214*h* that corresponds to the spacing between the adjacent conductive elements of the Mx+1 metal pattern 208 and, in a zero-offset configuration, the spacing between adjacent conductive elements of the Mx metal pattern 202. In some embodiments, the trapezoidal vias 204 are oriented whereby the larger bases of each of the vias are opposed across the horizontal spacing 214*h*.

Figure 3:
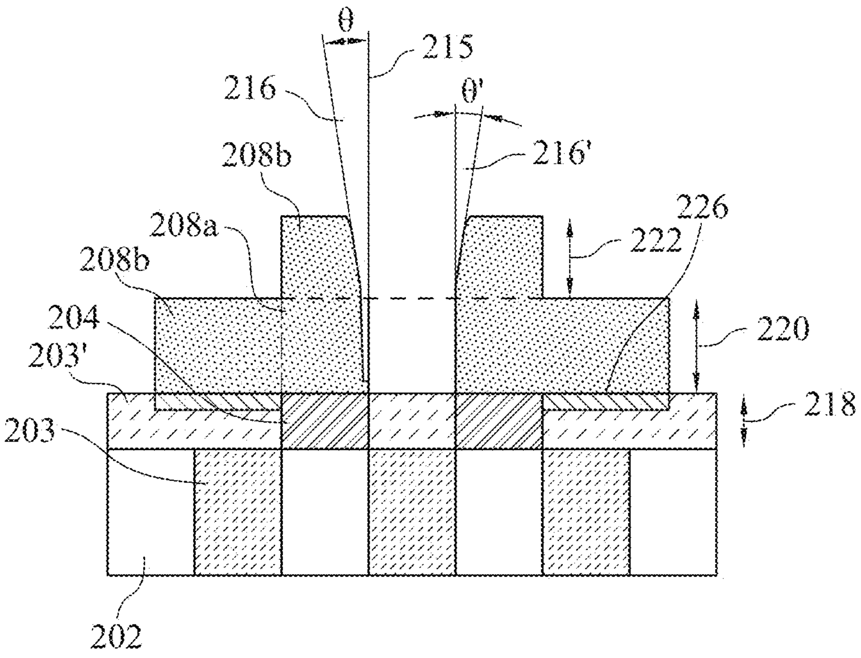
FIG. 3 is a cross-section view of IC device structures according to some embodiments.

FIG. 3 is a cross-section view of IC device structures according to some embodiments further illustrating a relationship between the Mx metal pattern 202, the vias 204, and the Mx+1 metal pattern 208 with a relationship between the thickness 218 of the vias 204 and second ILD 203', the thickness 220 of a lower portion of the Mx+1 metal pattern 208*a*, and the thickness 222 of a second portion of the Mx+1 metal pattern 208*b* that, in some embodiments is formed both above and beside the lower portion of the Mx+1 metal pattern 208*a*. In some embodiments, some of the second portion of the Mx+1 metal pattern 208 extends over an implanted region 226. In some embodiments the sidewall of the lower portion of the Mx+1 metal pattern 208*a* and/or the second portion of the Mx+1 metal pattern 208*b* are substantially vertical. In some embodiments, however, the sidewall of the lower portion of the Mx+1 metal pattern 208*a* and/or the second portion of the Mx+1 metal pattern 208*b* are not vertical but are sloped and define an Mx+1 slope angle 216 (θ) or, in some embodiments, two different Mx+1 slope angles 216, 216' (θ, θ') for the lower and upper portions of the Mx+1 metal pattern, relative to a substrate surface normal axis 215. In some embodiments, the sidewall slope angle(s) are between about 0 and 5°. In some embodiments, both the sidewalls of both the lower and second portions of the Mx+1 metal pattern 208 are vertical.

In some embodiments, each of the thickness values for the vias 218, a lower portion of Mx+1 metal pattern 220, and an upper portion of the Mx+1 metal pattern 222 falls within 100-200% of a minimum thickness value target. In some embodiments, each of the thickness values 218, 220, 222 independently fall within a range of 10-20 nm. If the thickness values 218, 220, 222 are less than about 10 nm, the resistance of the resulting structure will increase and will tend to degrade the IC device performance and/or lifetime, in some instances. If the thickness values 218, 220, 222 are greater than about 20 nm, additional ASD processing time will be used to obtain the increased thickness without a commensurate improvement in the performance or lifetime of the resulting IC device, thereby increasing cycle time and reducing IC device output, in some instances.

In some embodiments, each level of the MLI structure manufactured during BEOL operations utilizes MoM ASD operations for forming via and metal pattern structures and thereby improving alignment between sequentially formed BEOL elements and providing for increased via and metal pattern density in comparison with other approaches.

Figure 4A:
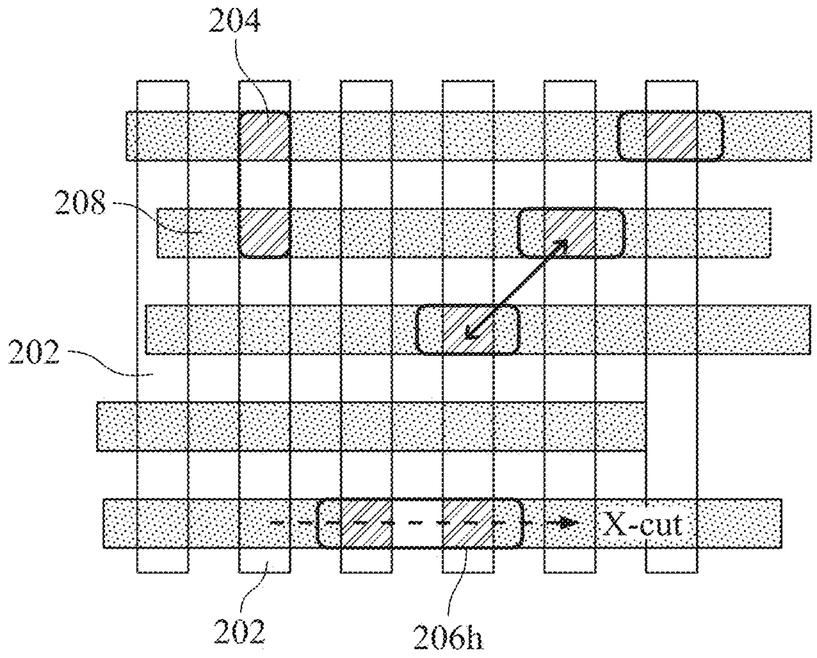
FIGS. 4A-H are cross-section views of IC device structures according to some embodiments.

FIG. 4A is a plan view and FIGS. 4B-H are a series of cross-section views of IC device structures during the manufacturing process according to some embodiments. FIG. 4A is a plan view of an IC device structure as illustrated in FIG. 2A with a cross-section line (X-cut) indicated across horizontal via pattern openings 206*h* that cuts through the Mx metal pattern 202, vias 204, and the Mx+1 metal pattern 208. FIGS. 4B-4H are views taken along the X-cut line in FIG. 4A.

Figure 4B:
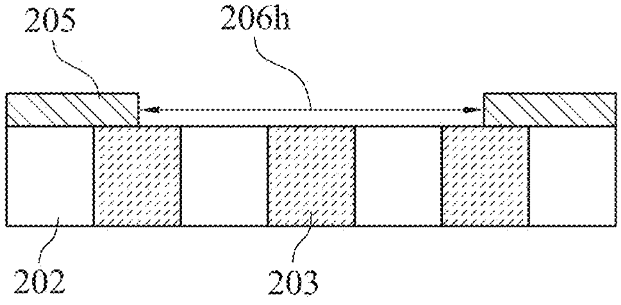

FIG. 4B is a cross-section view of the IC device structure after formation of the Mx metal pattern 202 in which adjacent conductive elements of the Mx metal pattern 202 are separated by a dielectric layer 203. A first hard mask (HM) layer (not shown) is then formed on the substrate, patterned, and etched to form the hard mask 205 in order to expose portions of the upper surfaces of the Mx metal pattern 202 and some of the upper surfaces of adjacent portions of the dielectric layer 203 in a single opening 206*h*.

Figure 4C:
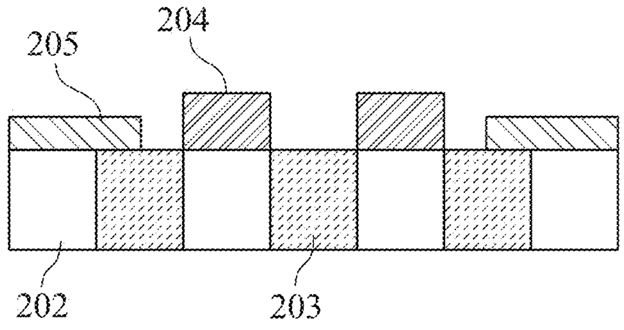

FIG. 4C is a cross-section view of the IC device structure similar to FIG. 4B in which the hard mask has been opened to expose portions of the upper surfaces of the Mx metal pattern 202. A via MoM ASD operation is then conducted to selectively deposit one or more conductive materials onto the exposed portions of the upper surfaces of the Mx metal pattern 202 to form vias 204 (Vx). In some embodiments, the conductive material(s) deposited to form the vias 204 will be sufficiently thick so as to extend above a plane defined by the surface of the hard mask 205. According to some embodiments, utilizing the ASD process confines the via structure 204 growth to the area directly above the exposed upper surfaces of the Mx metal pattern 202 and provides precise alignment between the edges of the Mx metal pattern and the via structure, i.e., a no offset or "zero enclosure" configuration. The precise alignment of the two vertically aligned conductive structures, e.g., the Mx metal pattern and the via structure, comprises a first zero enclosure conductive stack configuration.

Figure 4D:
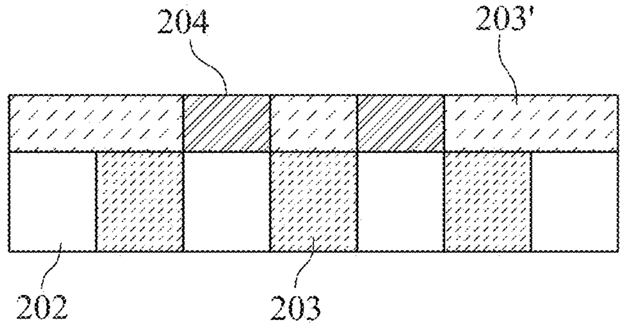

FIG. 4D is a cross-section view of the IC device structure similar to that of FIG. 4C. In FIG. 4D the residual portion of the hard mask has been removed and a low-K dielectric layer 203' (LK) has been deposited over the substrate and the vias 204 (Vx). The wafer is then planarized using, for example, chemical-mechanical polishing (CMP), to provide a planar surface that exposes upper surfaces of the vias 204 and upper surfaces of the residual portion of the low-K dielectric layer 203' that surrounds and insulates the vias from one another.

Figure 4E:
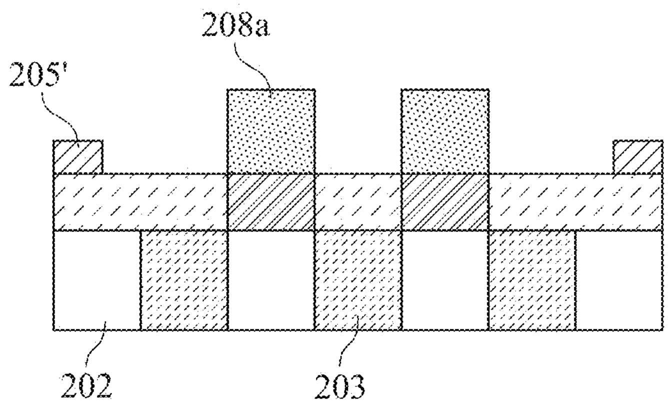

FIG. 4E is a cross-section view of the IC device structure similar to that of FIG. 4D. In FIG. 4E a second hard mask 205' (HM) layer has been formed on the substrate, patterned, and etched to open the hard mask (HM Open) in order to expose portions of the upper surfaces of the vias 204 and upper surfaces of portions of the low-K dielectric layer 203' surrounding the vias. A Mx+1 metal pattern MoM ASD operation is then conducted to selectively deposit one or more conductive materials onto the exposed portions of the upper surfaces of the vias 204 to form a first portion the Mx+1 metal pattern 208*a*. In some embodiments, the conductive material(s) deposited will be sufficiently thick so as to extend above a plane defined by the surface of the hard mask 205'. According to some embodiments, utilizing the ASD process confines the Mx+1 metal pattern 208 growth to the area directly above the exposed upper surfaces of the vias 204 and provides precise alignment between the edges of the Mx metal pattern, the vias, and the Mx+1 metal pattern, i.e., a no offset or "zero enclosure" configuration. The precise alignment of the three vertically aligned conductive structures, e.g., the Mx metal pattern, the via structure, and the Mx+1 metal pattern, comprises a second zero enclosure conductive stack configuration. In some embodiments additional via structures and/or Mx+1+n metal patterns are included in larger and/or additional zero enclosure stack configurations.

Figure 4F:
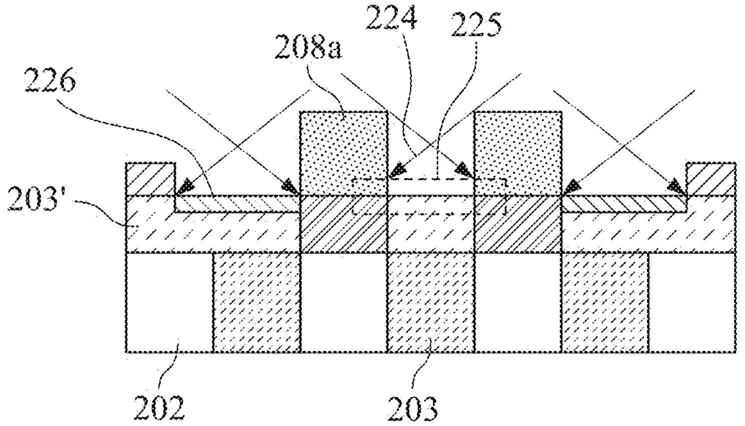

FIG. 4F is a cross-section view of the IC device structure similar to that of FIG. 4E. In FIG. 4F the first portion the Mx+1 metal pattern 208*a* is used as an implant mask during a tilt angle implant. The angle between the substrate surface normal axis and the ion beam is defined as the tilt angle. In some embodiments, a non-zero tilt angle is used to avoid or suppress channeling effects in crystalline silicon, to introduce dopants, for example, B, P, or As, or other materials, for example, Si or Ge, into the sidewalls of a trench or other structure, or to implant dopants underneath a mask edge. In some embodiments the tilt angle implant is used for the selective modification of portions of the substrate surface in order to make the implanted portions more or less receptive to a subsequent ASD operation.

In some embodiments higher tilt angles are used to form large tilt angle implanted drain (LATID) and/or large tilt angle implanted punch-through stopper (LATIPS) structures. In FIG. 4F, however, the combination of the selected tilt angle and the thickness and spacing of the first portions of the Mx+1 metal pattern 208*a* combine to define an implant exclusion zone 225 or region between adjacent first portions of the Mx+1 metal pattern. Because of the shadowing effect provided by the surface topography during a tilt angle implant, the implanted species are screened from reaching the entire wafer surface and provides a selective implant operation. In FIG. 4F, for example, none of the implant species reaches the surface of the material(s) between the first portions of the Mx+1 metal pattern 208*a*, i.e., the implant exclusion zone 225, or under the second hard mask 205', while those portions of the low-κ dielectric layer 203' that are exposed between the second hard mask 205 and the first portions of the Mx+1 metal pattern will receive a predetermined level of one or more implanted species 224 into a surface region 226.

Figure 4G:
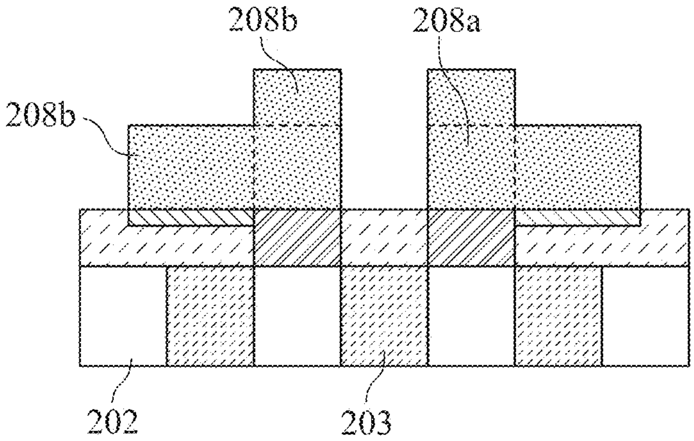

FIG. 4G is a cross-section view of the IC device structure similar to that of FIG. 4F. In FIG. 4G the residual portion of the second hard mask 205' has been removed and a second Mx+1 metal pattern MoM ASD operation has been conducted to selectively deposit one or more conductive materials onto the upper surfaces of the first portion of the Mx+1 metal pattern 208*a* and an implanted surface region 226 of the low-K dielectric layer 203' to form second portions of the Mx+1 pattern 208*b* that cooperate with the first portions of the Mx+1 metal pattern to form a composite Mx+1 metal pattern structure and to establish the full width of the Mx+1 metal pattern.

Figure 4H:
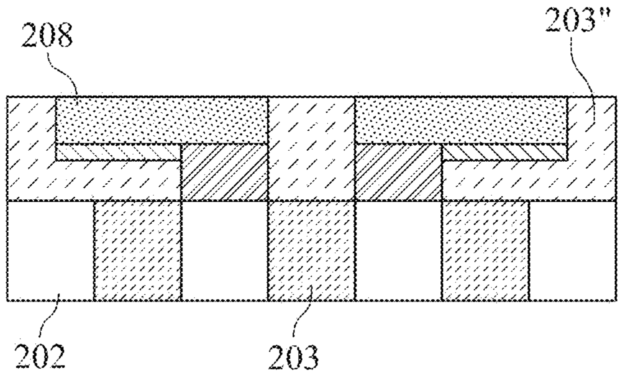

FIG. 4H is a cross-section view of the IC device structure similar to that of FIG. 4G. In FIG. 4H a second low-K dielectric layer 203" is formed over the composite Mx+1 metal pattern 208*a*/208*b* and then the wafer is planarized using, for example, a CMP process to remove the upper portions of the composite Mx+1 metal pattern 208*a*/208*b* and second low-K dielectric layer 203". The planarization process forms the final Mx+1 metal pattern 208 with adjacent conductive structures separated by residual portions of the second low-K dielectric layer 203". The wafer will then be subjected to additional BEOL processing to complete the IC device structure.

According to some embodiments, the method of FIGS. 4A-G will be utilized during the additional BEOL processing to form additional via/metal pattern layers above the Mx+1 metal pattern 208 for completing the full range of metal pattern layers and allowing proper functioning of the IC device. Because of the self-aligned nature of the via formation using a MoM ASD process, some embodiments of the method of FIGS. 4A-G allow for reduced via-to-via spacing, thereby increasing the available via locations and providing a zero Vx/Mx/Mx+1 enclosure stack that exhibits no pattern overlap (OVL) error without utilizing an alignment cut process for achieving the nearest end-to-end (E2E) pattern spacing. The minimum E2E spacing will be determined by a set of design rules utilized during the design of the IC device and will vary depending on the particular process node, N5, N5P, N3, etc., under which the device will be manufactured and will tend to decrease over time as imaging and processing techniques continue to improve. Some embodiments provide for a high UT pin access rule. In some embodiments, using the first portion of the Mx+1 metal pattern 208*a* as a tilt angle implant mask determines the minimum thickness of the Mx+1 metal layer to ensure that the implanted species is prevented from reaching the implant exclusion zone 225.

In some embodiments, the Mx metal pattern, the via pattern, and the Mx+1 pattern each independently comprise a conductive material such as a metal, a metal alloy, or a metal silicide. In some embodiments, the conductive material will include various combinations of materials to enhance the device performance and/or device longevity including, for example, a liner layer, a wetting layer, an adhesion layer, a metal fill layer, and/or one or more other suitable layers. In some embodiments, the primary conductive material will be selected from Ti, Ag, Al, TiAlN, TaC, TaCN, TaSiN, Mn, Zr, TiN, TaN, Ru, Mo, Al, WN, Cu, W, Re, Ir, Co, Ni, other suitable conductive materials, and combinations and alloys thereof.

In some embodiments, the dielectric materials will be deposited using materials having a high dielectric constant (k value), e.g., κ>3.9. In some embodiments, the high-k dielectric material includes one or more of $HfO_2$, $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, $SiO_xN_y$, and combinations thereof, or another suitable material. The high-k dielectric materials may be formed by ALD, physical vapor deposition (PVD), chemical vapor deposition CVD, plasma enhanced chemical vapor deposition (PECVD), thermal oxidation, and/or one or more other suitable method(s).

Figure 5:
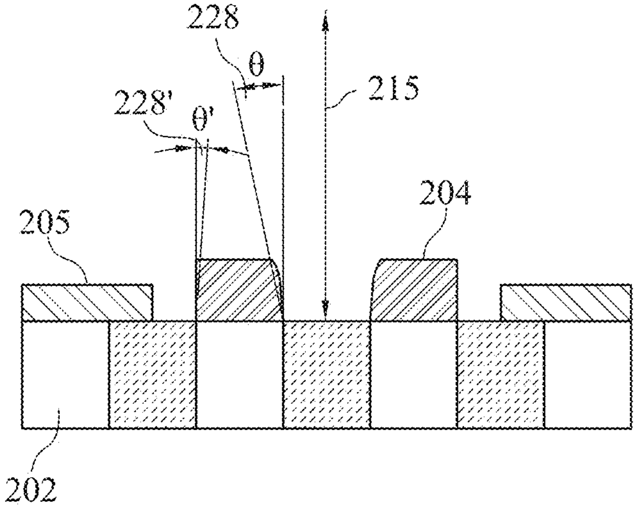
FIG. 5 is a cross-section view of IC device structures according to some embodiments.

FIG. 5 is a cross-section view of IC device structures according to some embodiments further illustrating the configuration of vias 204. In some embodiments the via sidewalls are substantially vertical. In some embodiments, however, one or both of the via sidewalls are not vertical but are sloped and define a via slope angle 228 (θ) or, in some embodiments, two different via slope angles 228, 228' (θ, θ') for the opposite via sidewalls, relative to a wafer surface normal axis 215. In some embodiments, the via slope angle(s) 228, 228' fall within a range of about 0 to 5°.

Figure 6A:
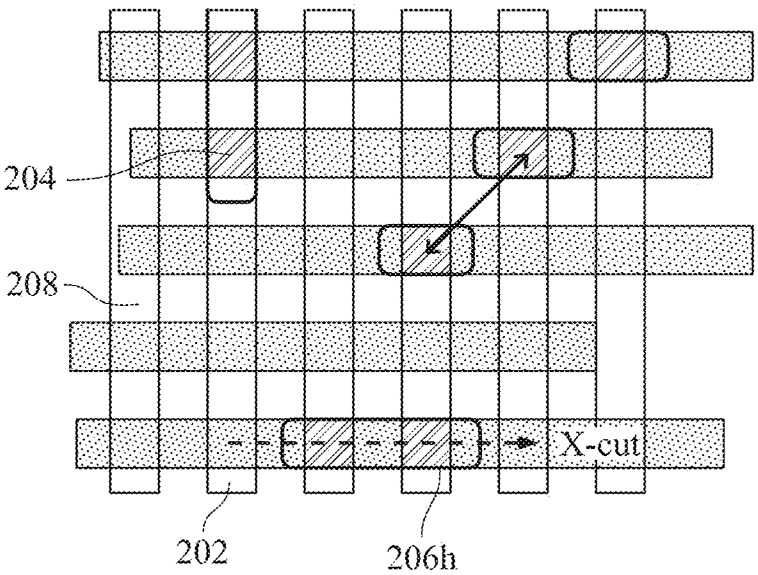
FIGS. 6A-H are cross-section views of IC device structures according to some embodiments.

FIGS. 6A-H are cross-section views of IC device structures according to some embodiments. FIG. 6A is a plan view and FIGS. 6B-H are a series of cross-section views of IC device structures formed during the manufacturing process according to some embodiments. FIG. 6A is a plan view of an IC device structure similar to FIG. 2A with a cross-section line (X-cut) indicated across horizontal via pattern opening 206*h* that cuts through the Mx metal pattern 202, vias 204, and the Mx+1 metal pattern 208.

Figure 6B:
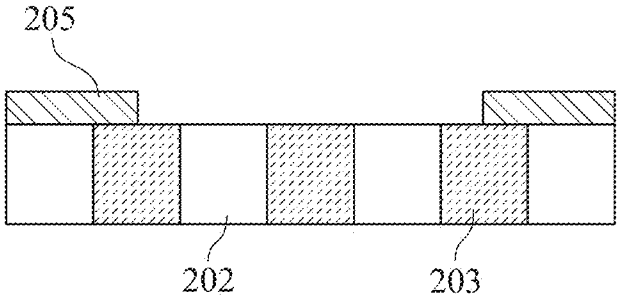

FIG. 6B is a cross-section view of the IC device structure after formation of the Mx metal pattern 202 in which adjacent conductive elements of the Mx metal pattern are separated by a dielectric layer 203. A first hard mask (HM) layer 205 is then formed on the wafer, patterned, and etched to open the hard mask (HM Open) in order to expose portions of the upper surfaces of the Mx metal pattern 202 and some of the upper surfaces of adjacent portions of the dielectric layer 203.

Figure 6C:
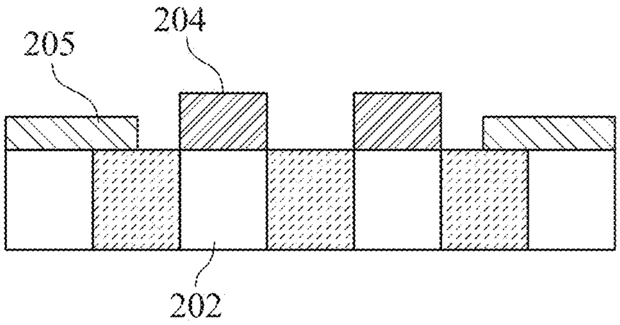

FIG. 6C is a cross-section view of the IC device structure after the hard mask has been opened to expose portions of the upper surfaces of the Mx metal pattern 202. A via MoM ASD operation is then conducted to selectively deposit one or more conductive materials onto the exposed portions of the upper surfaces of the Mx metal pattern 202 to form vias 204 (Vx). In some embodiments, the conductive material(s) deposited to form the vias 204 will be sufficiently thick so as to extend above a plane defined by the surface of the hard mask 205. According to some embodiments, utilizing the ASD process confines the via 204 growth to the area directly above the exposed upper surfaces of the Mx metal pattern 202 and provides precise alignment between the edges of the Mx metal pattern and the vias, i.e., a no offset or "zero enclosure" configuration.

Figure 6D:
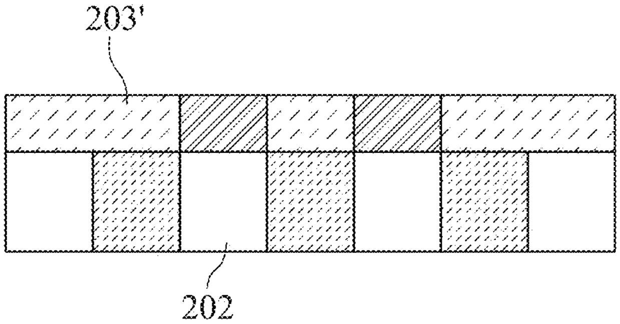

FIG. 6D is a cross-section view of the IC device structure similar to that of FIG. 6C. In FIG. 6D the residual portion of the hard mask has been removed and a low-κ dielectric layer 203' (LK) has been deposited over the wafer and the vias 204 (Vx). The wafer is then planarized using, for example, a chemical-mechanical polishing (CMP) process, to provide a planar surface that exposes upper surfaces of the vias 204 and upper surfaces of the residual portion of the low-κ dielectric layer 203' that surrounds and insulates the vias from one another.

Figure 6E:
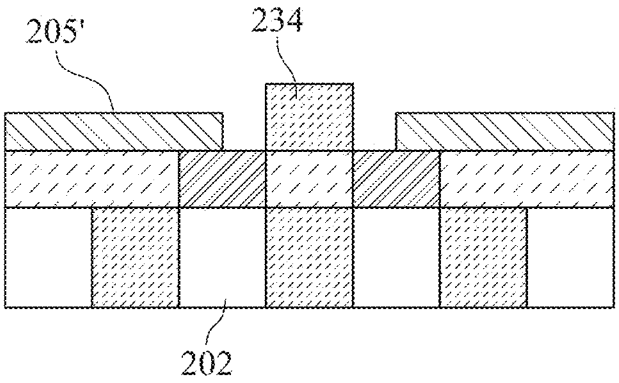

FIG. 6E is a cross-section view of the IC device structure similar to that of FIG. 6D. In FIG. 6E a second hard mask 205' (HM) layer has been formed on the wafer, patterned, and etched to open the hard mask (HM Open) in order to expose portions of the upper surfaces of the vias 204 and upper surfaces of portions of the low-κ dielectric layer 203' between the vias. A DoD ASD operation is then conducted to selectively deposit one or more dielectric materials onto the exposed portions of the upper surface(s) of the low-κ dielectric layer 203' to form a dielectric structure 234. In some embodiments, the dielectric material(s) deposited will be sufficiently thick so as to extend above a plane defined by the surface of the hard mask 205'. According to some embodiments, utilizing the ASD process confines the dielectric structure 234 growth to the area directly above the exposed upper surfaces of the dielectric material 203' situated between the vias 204 and provides precise alignment between the edges of the dielectric structure and the vias. In some embodiments, the aligning of the edges of the dielectric structure 234 and the vias 204 provides a no offset or "zero enclosure" configuration between the subsequently deposited Mx+1 metal layer 208 and the vias, thereby allowing the use of a non-area specific deposition for the Mx+1 metal layer (not shown).

Figure 6F:
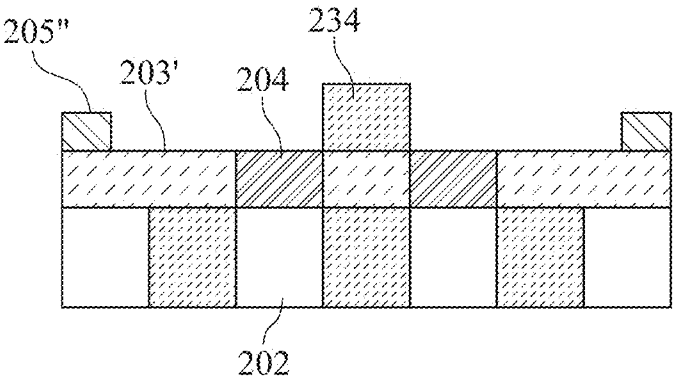

FIG. 6F is a cross-section view of the IC device structure similar to that of FIG. 6E. In FIG. 6F the second hard mask 205' (HM) layer has been patterned and etched to open the hard mask to form a third hard mask 205" in order to expose the upper surfaces of the vias 204 and upper surfaces of additional portions of the low-κ dielectric layer 203' surrounding the vias.

Figure 6G:
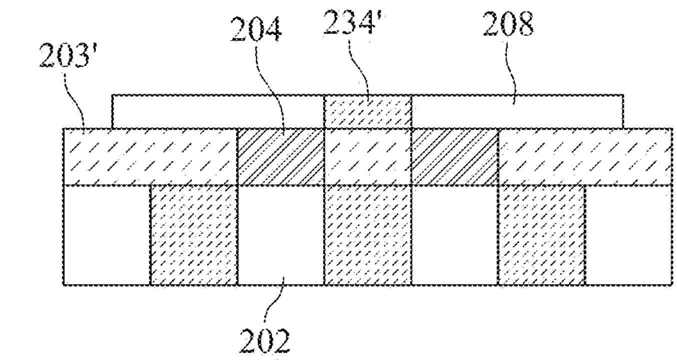

FIG. 6G is a cross-section view of the IC device structure similar to that of FIG. 6F. In FIG. 6G a Mx+1 metal layer is then formed over the wafer and then subjected to a CMP or etchback planarization process that removes the upper portions of the Mx+1 metal layer and the dielectric structure 234. The planarization process forms the Mx+1 metal pattern 208 with a residual portion of the dielectric structure 234' separating adjacent portions of the Mx+1 metal pattern.

Figure 6H:
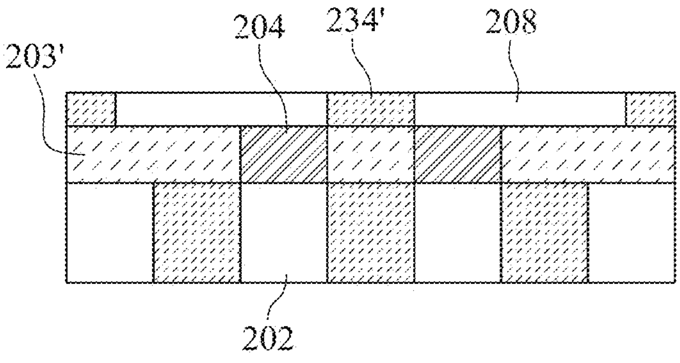

FIG. 6H is a cross-section view of the IC device structure similar to that of FIG. 6G. In FIG. 6H a third low-κ dielectric layer 203" is formed over the Mx+1 metal pattern 208 and then the wafer is planarized using, for example, a CMP or etchback process to remove the upper portions of the Mx+1 metal pattern 208 and the dielectric structure 234. The planarization process forms the final Mx+1 metal pattern 208 with adjacent conductive structures separated by residual portions of the dielectric structure 234'. In some embodiments, after removing the third hard mask 205", a third dielectric layer 203" is deposited on the wafer and planarized to provide a dielectric pattern that further insulates adjacent portions of the Mx+1 metal pattern 208. In some embodiments, the wafer will then be subjected to additional BEOL processing to complete the IC device structure.

According to some embodiments, the method of FIGS. 6A-G will be utilized during the additional BEOL processing to form additional via/metal pattern layers above the Mx+1 metal pattern 208 for completing the full range of metal pattern layers and allowing proper functioning of the IC device. Because of the self-aligned nature of the via formation using a MoM ASD process, some embodiments of the method of FIGS. 6A-G allow for reduced via-to-via spacing, thereby increasing the available via locations and providing a zero Vx/Mx/Mx+1 enclosure stack that exhibits no pattern overlap (OVL) error without utilizing an alignment cut process for achieving the nearest end-to-end (E2E) pattern spacing. Some embodiments provide for a high UT pin access rule.

Figure 7A:
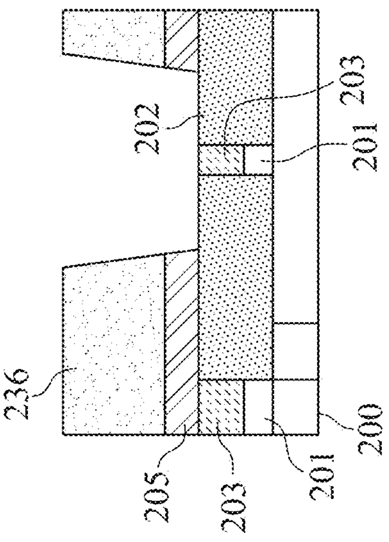
FIGS. 7A and 7B are cross-section views of IC device structures according to some embodiments and FIGS. 7C and 7D are plan views of the IC device structures shown in FIGS. 7A and 7B.
Figure 7B:
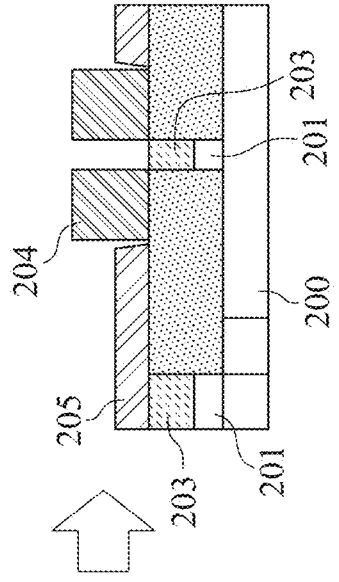
Figure 7C:
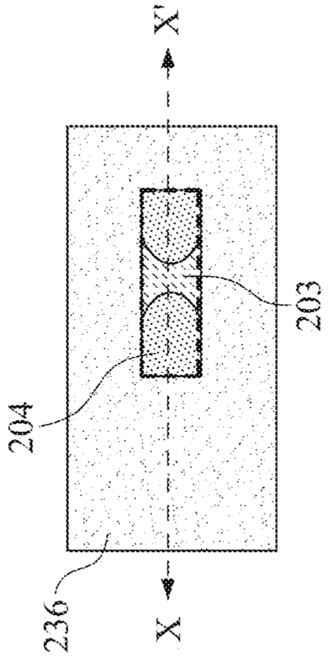
Figure 7D:
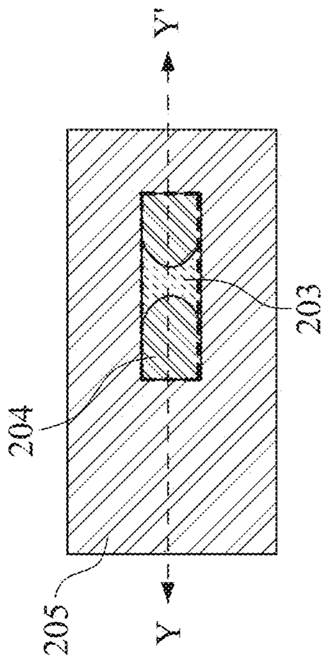

FIGS. 7A and 7B are cross-section views of IC device structures according to some embodiments and FIGS. 7C and 7D are plan views of the IC device structures shown in FIGS. 7A and 7B according to some embodiments. FIG. 7A is a cross-section view of IC device structures according to some embodiments in which an etch stop layer 201 (ESL) is formed over a substrate 200. A dielectric layer 203 is then formed over the etch stop layer 201. The dielectric layer 203 is patterned and etched to open a Mx metal pattern that is then filled with one or more conductive materials after which the wafer is planarized to remove upper portions of the conductive material(s) and dielectric layer to form the Mx metal pattern 202 (M0). A hard mask layer is then formed over the wafer and a mask pattern 236 is formed on the hard mask layer and used as an etch mask to form a hard mask 205 that exposes portions of the Mx metal pattern 202 that are separated by the dielectric layer 203. FIG. 7C is a plan view of the IC device structure of FIG. 7A with the cross-sectional plane designated by line X-X' extending across the mask pattern 236, the exposed regions of the Mx metal pattern 202 and the portion of the dielectric layer 203 separating the Mx metal pattern elements.

FIG. 7B is a cross-section view of the IC device structure similar to that of FIG. 7A according to some embodiments in which mask pattern 236 has been removed from the hard mask 205. Vias 204 are then formed over the exposed portions of the Mx metal pattern 202 utilizing a via MoM ASD operation that selectively deposits one or more conductive materials onto the exposed portions of the upper surfaces of the Mx metal pattern 202 to form vias 204 (V0). In some embodiments, the conductive material(s) deposited to form the vias 204 will be sufficiently thick so as to extend above a plane defined by the surface of the hard mask 205. FIG. 7D is a plan view of the IC device structure of FIG. 7B with the cross-sectional plane designated by line Y-Y' extending across the hard mark 205, the vias 204, and the portion of the dielectric layer 203 separating the Mx metal pattern elements.

Figure 8:
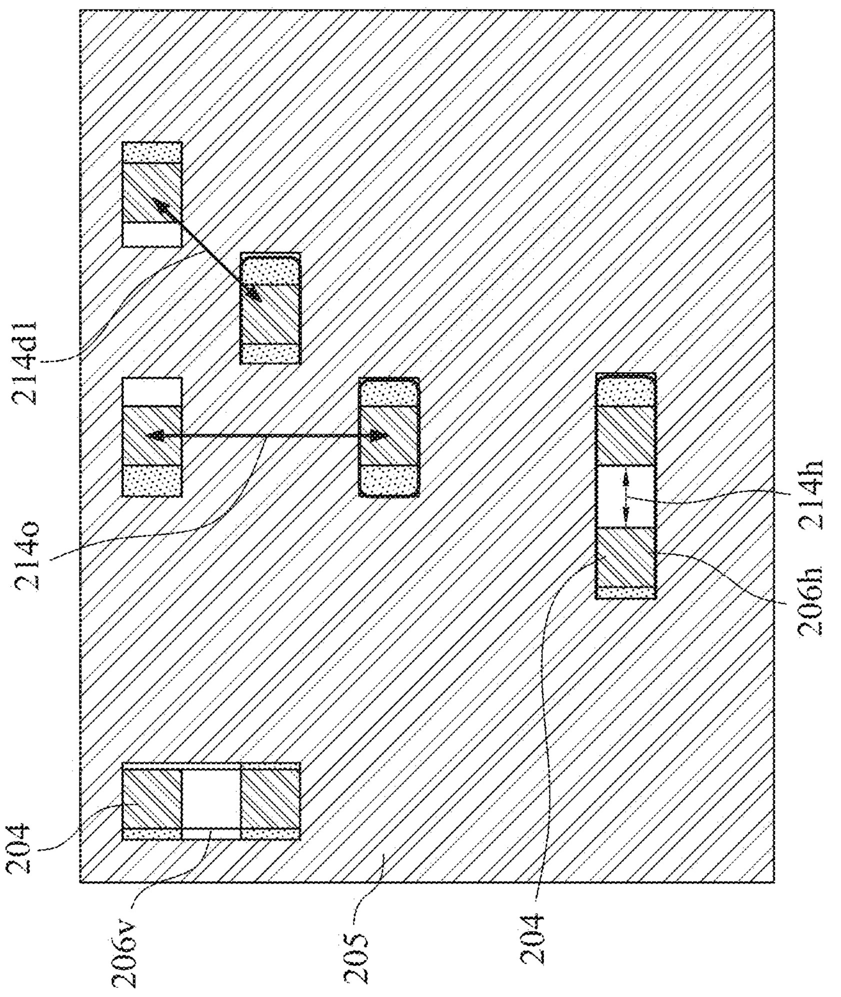
FIG. 8 is a plan view of IC device structures according to some embodiments.

FIG. 8 is a plan view of IC device structures according to some embodiments in which an extreme ultraviolet (EUV) imaging system using light having a wavelength on the order of 13.5 nm is used in patterning the hard mask 205. The hard mask 205 includes a number of openings in which portions of the Mx metal pattern 202 are exposed for via 204 formation. In some embodiments, the via pattern includes vertical via pattern openings 206*v* that provide for the simultaneous formation of a pair of vias on adjacent ends of first and second conductive pattern elements in the Mx metal pattern 202 with the two vias being separated by a vertical spacing 214*v*. In some embodiments, the via pattern includes single via pattern openings 206*s* that provide for the formation of single vias at various locations above the Mx metal pattern with adjacent single vias having a diagonal separation distance 214*d*1. In some embodiments, particularly in an array of single vias 204 or in the relationship between paired vias and single vias, other via-to-via spacing 2140 will be a design consideration. In some embodiments, the via pattern includes horizontal via pattern openings 206*h* that provide for the formation of a pair of vias on adjacent first and second parallel conductive pattern elements in the Mx metal pattern 202 with the two vias being separated by a horizontal spacing 214*h* that corresponds to the end-to-end (E2E) spacing of the separate conductive pattern elements in the Mx metal pattern.

Figure 9:
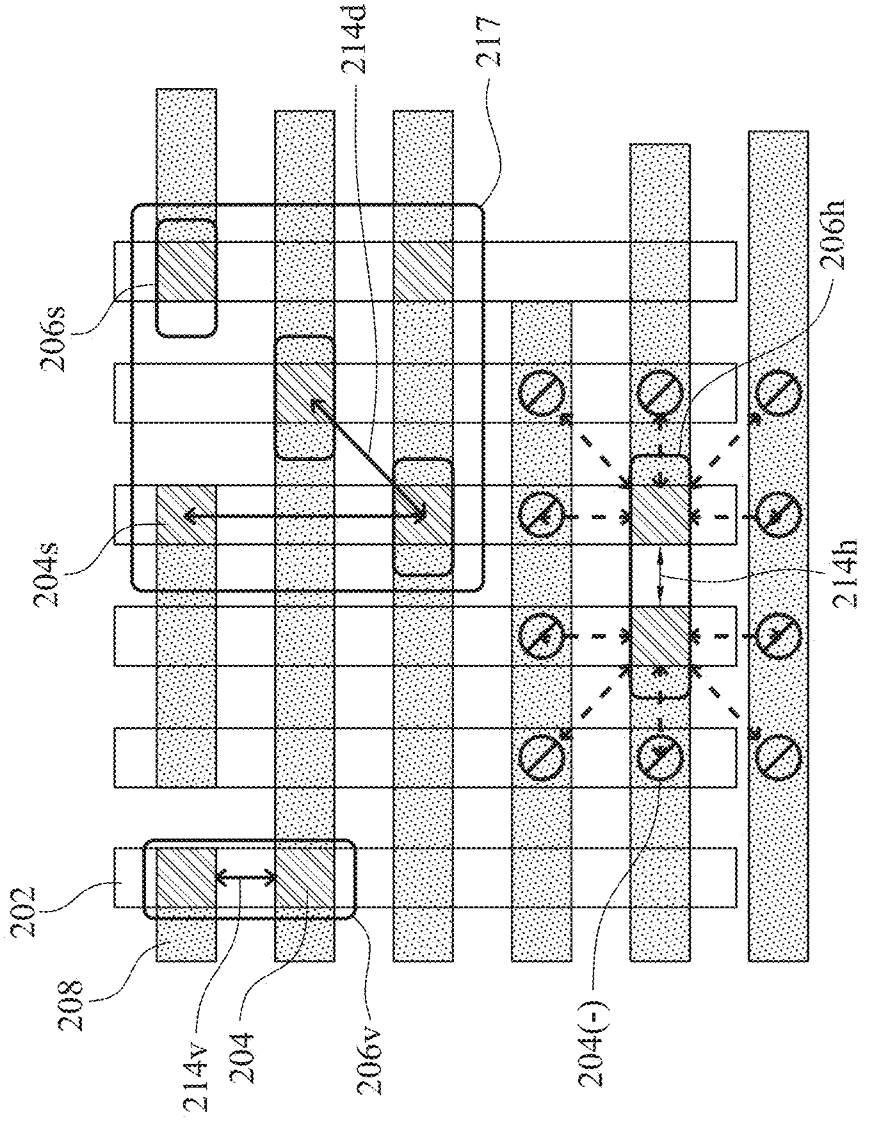
FIG. 9 is a plan view of IC device structures according to some embodiments.

FIG. 9 is a plan view of IC device structures according to some embodiments in which portions of the Mx metal pattern 202 are exposed for via 204 formation. In some embodiments the use of via and Mx+1 MOM ASD processes produces a zero enclosure Mx/Vx/Mx+1 stack in which the vias 204 are formed only over the exposed portion of the Mx metal pattern 202 and the Mx+1 metal pattern 208 is formed on the exposed portion of the vias, thereby preventing or suppressing misalignment of the three conductive elements. In some embodiments, this ability to produce such a zero enclosure structure provides for the simultaneous formation of a pair of vias 204 in a single hard mask 205 via opening 206*h* having reduced end-to-end (E2E) horizontal spacing 214*h* values below 20 nm and, in some embodiments E2E spacing on the order of 14 nm. In some embodiments vertical pairs of vias 204 are formed in opening 206*v* with the via-to-via vertical spacing 214*v* being the same as the Mx+1 metal pattern spacing. In some embodiments, while providing for reductions in the E2E spacing between pairs of adjacent vias 204, the design rules preclude the placement of vias in certain adjacent potential via positions 204(−) around the paired vias 204, e.g., the via separation needs to be greater than one pattern/one etch (1P1E) EUV pitch. In some embodiments, however, a plurality of single vias 204*s* will comprise a via array 217 in which the diagonal via spacing 214*d*1 is equivalent to at least the minimum via-to-via spacing, e.g., 1P1E pitch as defined in the design rules.

Figure 10:
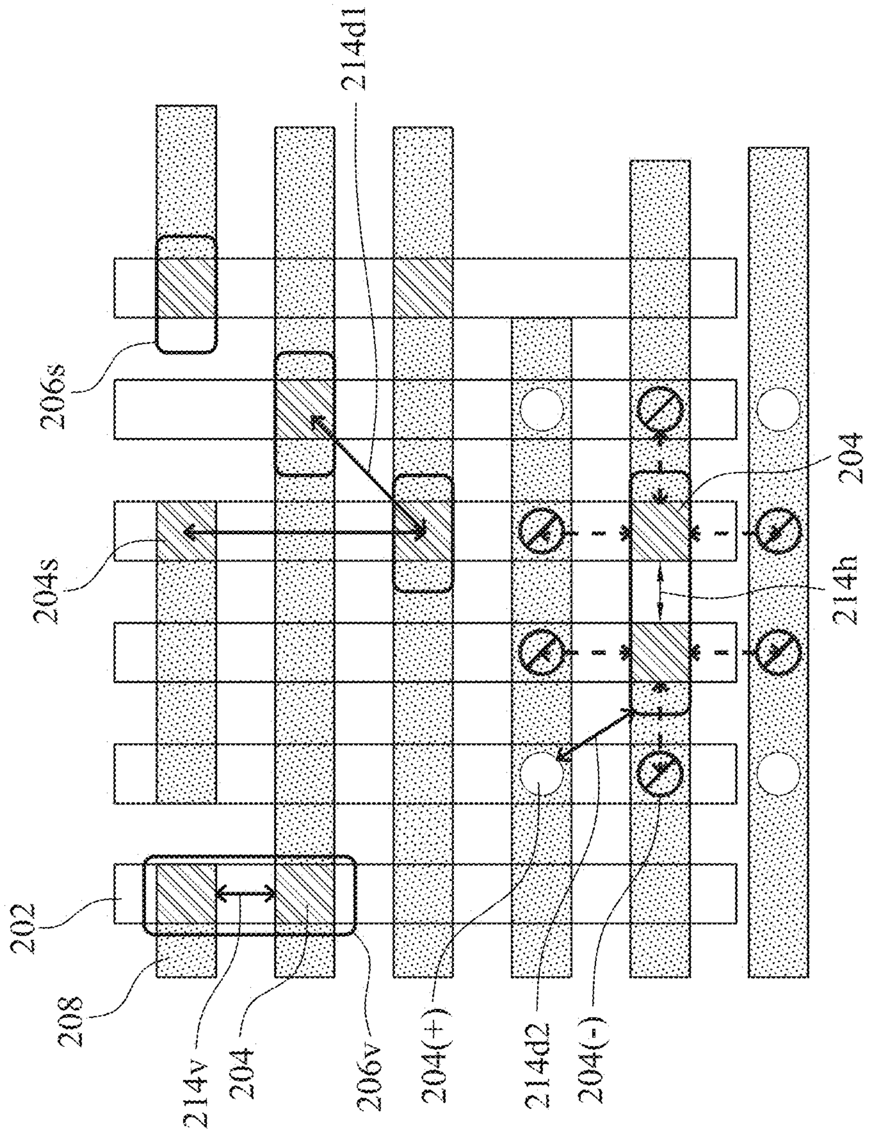
FIG. 10 is a plan view of IC device structures according to some embodiments.

FIG. 10 is a plan view of IC device structures according to some embodiments in which portions of the Mx metal pattern 202 are exposed for via 204 formation. In some embodiments, the use of via and Mx+1 metal pattern MoM ASD processes produces a zero enclosure Mx/Vx/Mx+1 stack in which the vias 204 are formed only over the exposed portion of the Mx metal pattern 202 with the Mx+1 metal pattern 208 being formed on the exposed portion of the vias, thereby preventing or suppressing misalignment of the three conductive elements, i.e., achieving a substantially perfect overlay of the elements. In some embodiments, this ability to produce such a zero enclosure structure provides for the simultaneous formation of a pair of vias 204 in a single hard mask 205 via opening 206*h* having reduced end-to-end (E2E) horizontal spacing 214*h* values below 20 nm and, in some embodiments E2E spacing on the order of 14 nm. This reduced E2E spacing allows for an increased density of the IC devices and, in some embodiments, reduced power consumption. In some embodiments, while providing for reductions in the E2E spacing between pairs of adjacent vias 204, the design rules are also modified to remove or relax metal placement limitations and allow for the placement of vias in certain adjacent potential via positions 204(+) around the paired vias 204, e.g., the via separation needs to be at least 1P1E EUV pitch, while continuing to preclude placement of vias in certain other adjacent potential via positions 204(−) around the paired vias 204, e.g., in which the via separation 214*d*2 is less than the minimum via-to-via spacing of, for example, 1P1E EUV pitch diagonal via spacing 214*d*1. The availability of adjacent potential via positions for locating vias is determined, in part, by the degree of control achievable by the combination of patterning and etching operations used to form the paired vias. If, as shown in FIG. 10, the particular combination of patterning and etching operations provides sufficient control of the shape and size of the paired vias to provide a spacing 214*d*2 that meets the 1P1E EUV pitch, the diagonally adjacent potential via positions 204(+) are available for forming single vias. As the combination of patterning and etching operations used to form the paired vias continues to improve and provide more accurate resolution of the device layer patterns, the number of adjacent potential via positions meeting the 1P1E EUV pitch spacing will increase accordingly.

Figure 11:
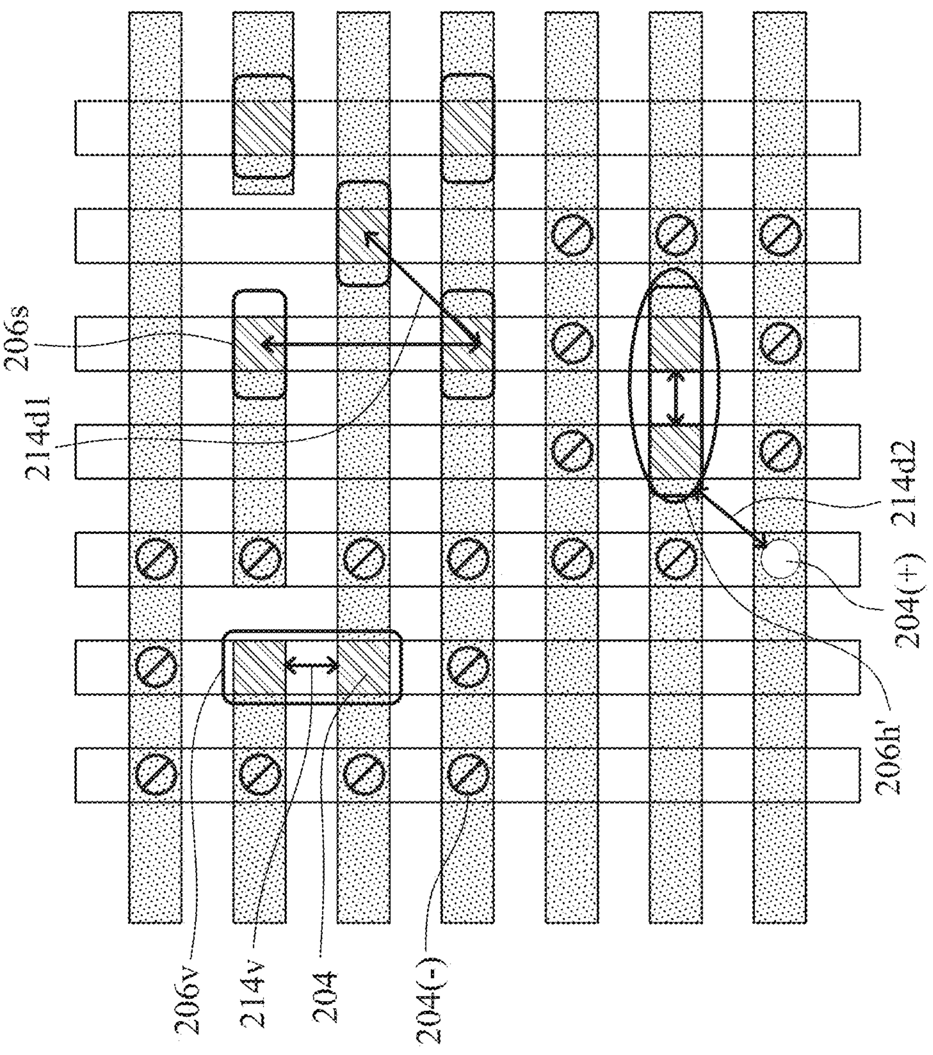
FIG. 11 is a plan view of IC device structures according to some embodiments.

FIG. 11 is a plan view of IC device structures according to some embodiments similar to those of FIGS. 9 and 10 in which the use of via and Mx+1 metal pattern MoM ASD processes produces a zero enclosure Mx/Vx/Mx+1 stack, thereby preventing or suppressing misalignment of the three conductive elements, i.e., achieving a substantially perfect overlay of the elements. In some embodiments, this ability to produce such a zero enclosure structure provides for the simultaneous formation of a pair of vias 204 in a single hard mask 205 via opening 206*v* having reduced Mx+1 metal spacing that precludes placement of vias in certain other adjacent potential via positions 204(−) around the paired vias 204, e.g., in which the via separation is less than the minimum via-to-via spacing of, for example, 1P1E EUV pitch diagonal via spacing 214*d*. In some embodiments, one or more of the adjacent potential via positions 204(+) surrounding may be suitable for via 204 placement under the applicable design rules for via openings 206*h*' in which the minimum spacing may be reduced for certain configurations. The availability of adjacent potential via positions for locating vias is determined, in part, by the degree of control achievable by the combination of patterning and etching operations used to form the paired vias. If, as shown in FIG. 11, the particular combination of patterning and etching operations does not provide sufficient control of the shape and size of the paired vias to provide a spacing 214*d*2 that meets the 1P1E EUV pitch, the diagonally adjacent potential via positions 204(−) will tend to be unavailable for forming single vias. In some embodiments, however, even if the particular combination of patterning and etching operations does not provide sufficient control of the shape and size of the paired vias to ensure that the spacing to each of the diagonally adjacent potential via positions has a spacing 214*d*2 that meets the 1P1E EUV pitch, adjusting one or more parameters will provide sufficient spacing for at least one of the diagonally adjacent potential via positions to be a viable via location 204(+). In some embodiments, the adjusted parameters include utilizing a modified or special pattern that shifts the paired via opening relative to the adjacent potential via positions, depth of focus (DoF) adjustment(s) to one or more source masks, and/or adjusting the configuration of the paired via opening through optical proximity correction (OPC).

Figure 12:
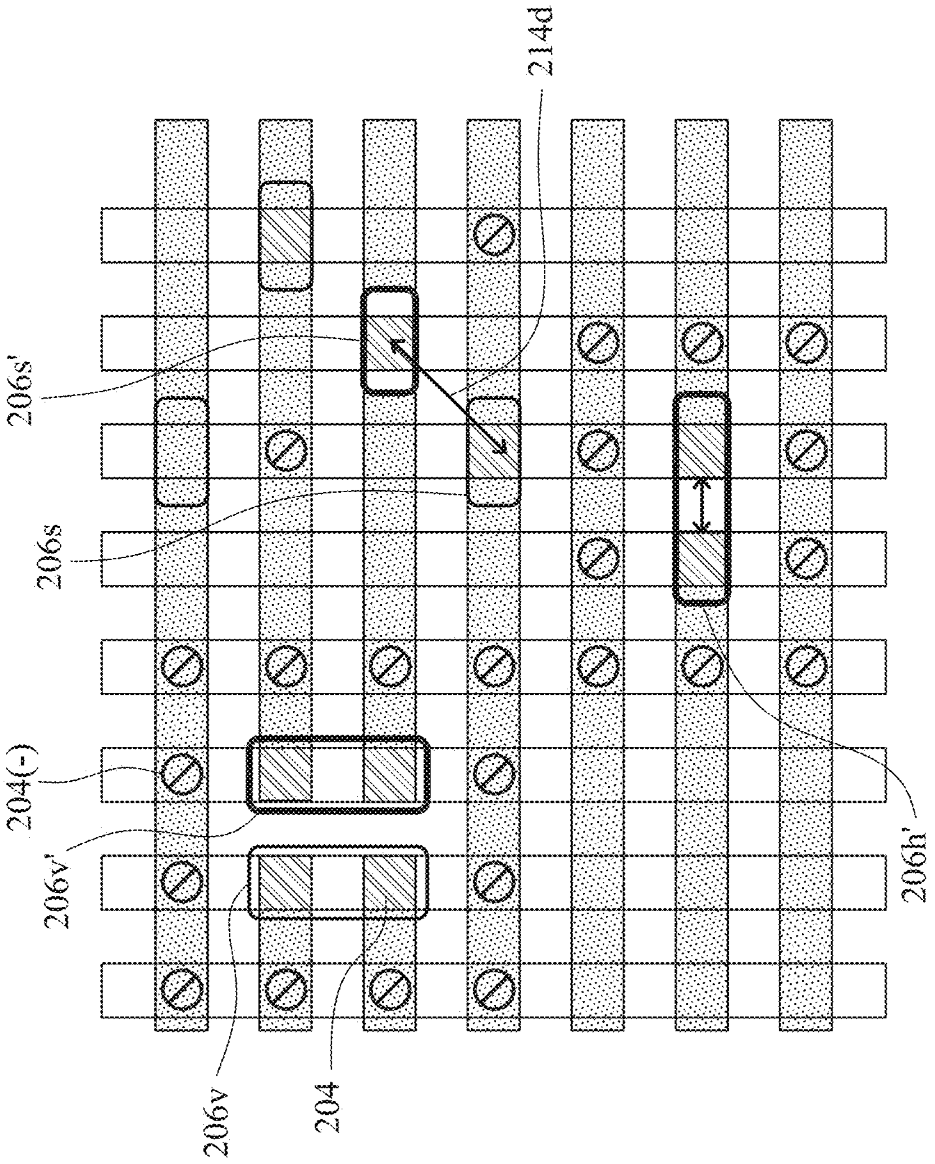
FIG. 12 is a plan view of IC device structures according to some embodiments.

FIG. 12 is a plan view of IC device structures according to some embodiments similar to those of FIGS. 9-11 in which the use of via and Mx+1 metal pattern MOM ASD processes produces a zero enclosure Mx/Vx/Mx+1 stack, thereby preventing or suppressing misalignment of the three conductive elements, i.e., achieving a substantially perfect overlay of the elements. In some embodiments, in order to improve imaging accuracy and reduce the size of the openings that are routinely formed, the via pattern openings are provided on different masks. This pair of counterpart masks are then used for making sequential exposures of the photoresist pattern arranged above the Mx metal pattern 202. In some embodiments, this pair of exposure operations forms a composite via opening pattern that includes first via openings 206*v*, 206*s* from the first exposure and second via openings 206*v*', 206*s*' from the second exposure. In some embodiments the composite pattern is then etched in a single etch operation to form the predetermined via openings, e.g., a two pattern/one etch process (2P1E). In some embodiments, the relative placement of vias precludes placement of additional in certain other adjacent via positions 204(–) around the paired vias 204, e.g., in which the via separation is less than the minimum via-to-via spacing of, for example, 1P1E EUV pitch diagonal via spacing 214*d*. In some embodiments, one or more of the adjacent via positions (not shown) may be suitable for via 204 placement under the applicable design rules.

Figure 13A:
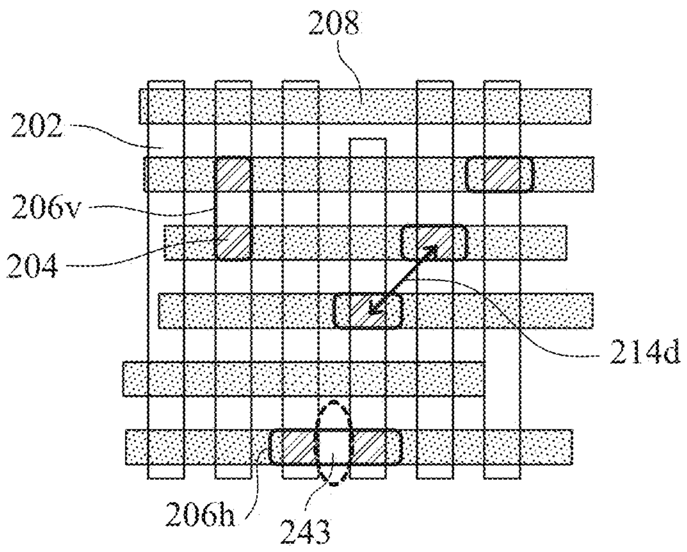
FIGS. 13A-E are plan views of IC device structures according to some embodiments.

FIGS. 13A-E are plan views of IC device structures according to some embodiments in which a cut metal pattern is utilized in forming the via 204 structures and/or the Mx+1 metal pattern 208. FIG. 13A is a plan view of IC device structures according to some embodiments including a Mx metal pattern 202, vias 204, via openings 206*v*, 206*h*, a Mx+1 metal pattern 208, and a cut metal region 243 with various embodiments being the subject of FIGS. 13B-F.

Figure 13B:
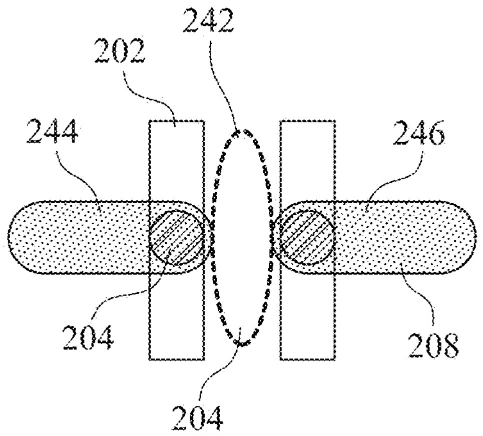

FIG. 13B is a plan view of IC device structures similar to FIG. 13A according to some embodiments including a Mx metal pattern 202, vias 204, via openings 206*h*, 206*v*, a Mx+1 metal pattern 208, and a cut metal pattern 242 in which a portion of the Mx+1 metal pattern has been removed to define the boundaries of the Mx+1a first net 244 and second net 246. Each net contains separate portions of the Mx+1 metal pattern 208 and is separated by a cut metal pattern 242 within the E2E spacing, e.g., 14-20 nm, corresponding to the smallest E2E spacing permitted under the applicable design rules. FIG. 13A presents some embodiments in which the cut metal pattern 242 is well aligned and centrally positioned relative to the residual portions of the Mx+1 metal pattern including the first net 244, second net 246, and the vias 204.

Figure 13C:
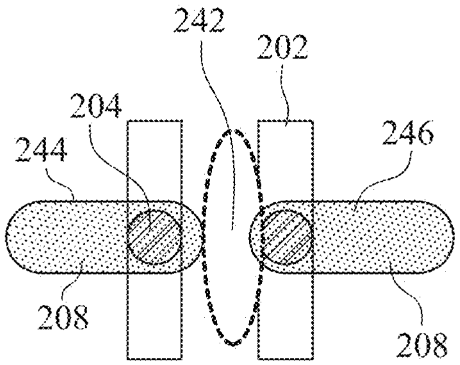

FIG. 13C is a plan view of IC device structures according to some embodiments including a Mx metal pattern 202, vias 204, via openings 206*v*, 206*h*, a Mx+1 metal pattern 208, and a cut metal pattern 242 similar to that of FIG. 13B. In FIG. 13C, however, the cut metal pattern 242 is slightly misaligned causing a reduction of conductive material on a first side towards which the cut metal pattern 242 is shifted in the E2E spacing relative to a second side away from which the cut metal region is shifted from the central location and results in the formation of asymmetric structures on opposite sides of the cut metal pattern. Depending on the degree of misalignment, some embodiments according to FIG. 13C will exhibit performance and/or yield degradation relative to the more accurately aligned configuration of FIG. 13B. In some embodiments, the potential for this shift in the cut metal pattern will be addressed by increasing the minimum E2E spacing so that a greater degree of misalignment can be tolerated without degrading the process yield. However, in so doing, the density of the device will tend to be decreased and will use more silicon to manufacture the same number of IC devices. In some embodiments, however, the shift to cut metal processing will decrease the processing time relative to an ASD process and will be utilized for one or more of the upper metal pattern layers that allow for larger lines and spaces and thereby increase overall manufacturing line output.

Figure 13D:
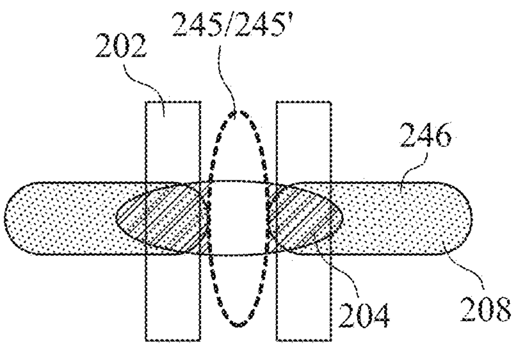

FIG. 13D is a plan view of IC device structures according to some embodiments including a Mx metal pattern 202, vias 204, via openings 206*v*, 206*h*, a Mx+1 metal pattern 208, and a pair of cut metal patterns 245, 245' similar to that of FIGS. 13B-C. In FIG. 13D, however, the cut metal patterns 245, 245' are used for sequentially cutting both the conductive material(s) forming the vias 204 and the conductive material(s) forming the Mx+1 metal pattern 208. According to some embodiments, the cut metal process includes a two-part etch using a single pattern with a first etch process/chemistry tailored to remove the exposed portions of the Mx+1 metal pattern 208 and a second etch process/chemistry tailored to remove the exposed portions of the vias 204. According to some embodiments the cut metal process by which the conductive materials are removed may include a two-part etch using a first pattern with a first etch process tailored to remove the exposed portions of the Mx+1 metal pattern 208 and a second pattern with a second etch process tailored to remove the exposed portions of the vias 204. According to some embodiments consistent with the IC device structure of FIG. 13D, the vias 204 extend beyond the limits of the Mx metal pattern 202 rather than be limited to the exposed surfaces of the underlying Mx metal pattern.

Figure 13E:
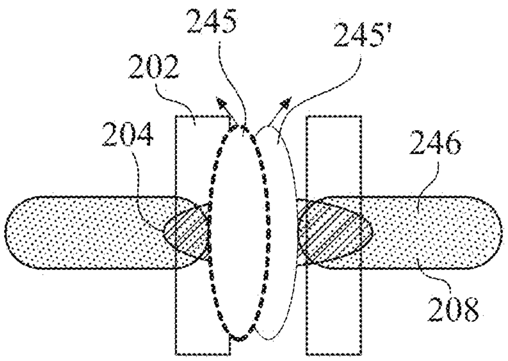

FIG. 13E is a plan view of IC device structures according to some embodiments including a Mx metal pattern 202, vias 204, via openings 206*v*, 206*h*, a Mx+1 metal pattern 208, and a cut metal region similar to that of FIGS. 13B-D. In FIG. 13E, however, the cut metal region is subjected to two etch patterns/masks (not shown) including a two-part patterning process in which a first cut metal pattern 245 is used to remove the exposed portions of the Mx+1 metal pattern. The first portion of the Mx+1 metal pattern is then removed using a first etch mask 245 process and a first etch process tailored to remove the exposed portions of the Mx+1 metal pattern 208 has been completed. The second portion of the Mx+1 metal pattern is then removed using a second etch mask 245' and a second etch process tailored to remove the exposed portions of the vias 204 and complete the cut metal processing. In some embodiments, the alignment offset between the first and second etch masks 245/245' (as shown in FIG. 13E) will remove unnecessary material and will tend to reduce the effective size of the vias, increase resistance, and potentially compromise the yield, the functionality, and/or the lifetime of the resulting IC devices will be degraded relative to the configuration achieved in FIG. 13D. In some embodiments, the potential for the misalignment in one or both of the cut metal patterns will be addressed by increasing the minimum E2E spacing so that a certain degree of misalignment can be tolerated without degrading the process yield. However, in so doing, the density of the device will be decreased and will use more silicon to manufacture the same number of IC devices. In some embodiments, however, the shift to cut metal processing for both via and Mx+1 patterns will decrease the processing time relative to using ASD processes and will be utilized for one or more of the upper metal pattern layers that allow for larger lines and spaces and thereby increase overall manufacturing line output.

Figure 14:
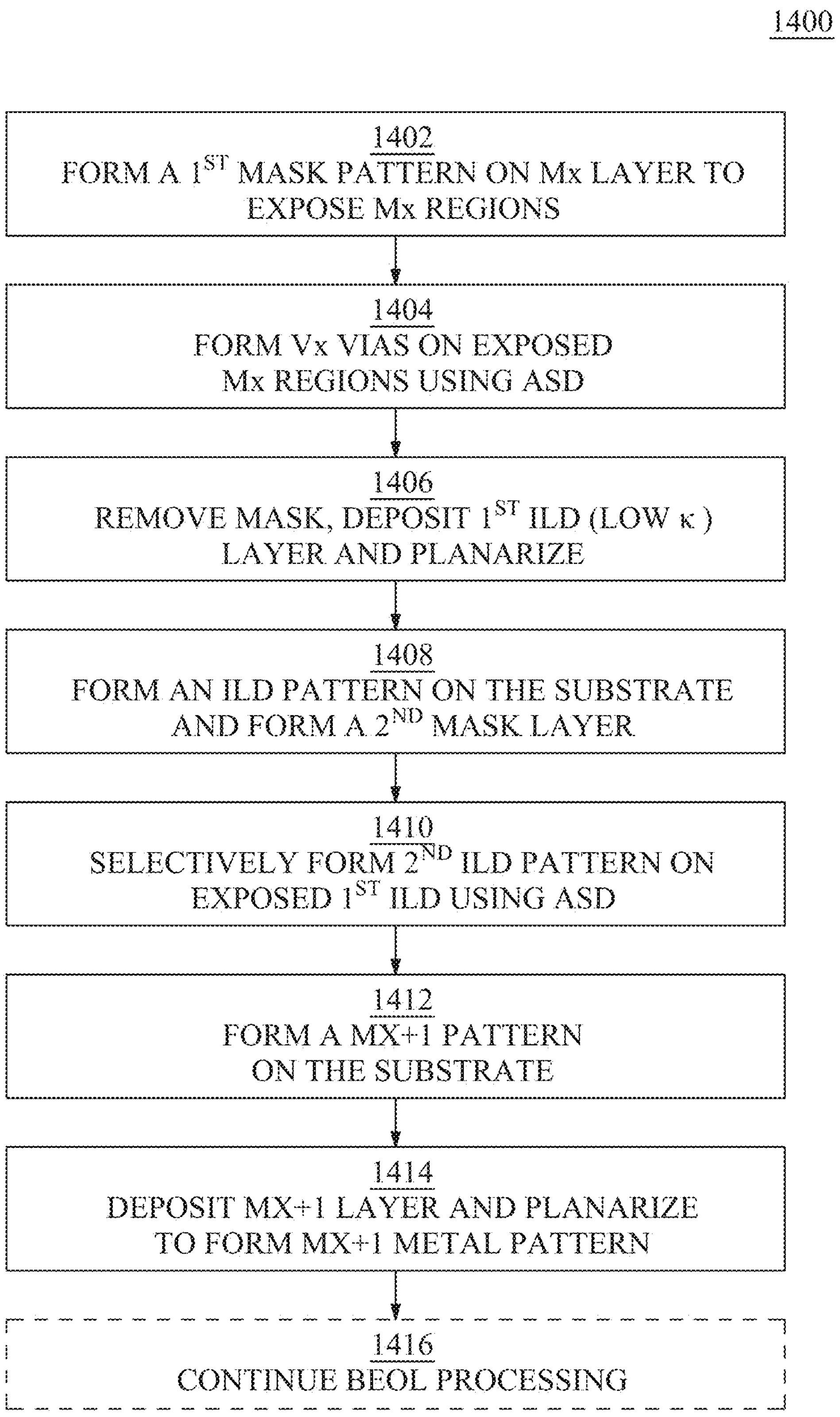
FIG. 14 is a flowchart of a manufacturing process for the production of IC devices according to some embodiments.

FIG. 14 is a flowchart of a manufacturing process 1400 for the production of IC devices according to some embodiments including, for example, some embodiments of the IC devices shown in FIGS. 4A-4H and FIGS. 6A-6H). In operation 1402 the wafer is processed to form a first metal pattern, Mx metal pattern, after which a first mask pattern (hard mask or HM) is applied to the Mx metal pattern that exposes those regions of the Mx metal pattern on which the vias are to be constructed.

In operation 1404 the exposed portions of the Mx metal pattern are utilized as the base for further processing using a MoM ASD to form a plurality of via structures. Using the ASD process allows the via structures to be precisely aligned with the Mx metal pattern because the growth of the via structures is limited to those exposed portions of the Mx metal pattern. By using the ASD process, the manufacturer avoids using a more traditional damascene process in which a substantial amount of material must be deposited and removed in order to obtain the via pattern.

In operation 1406 the first mask pattern is removed to expose a plurality of via structures that, in some embodiments, extended above the surrounding via mask pattern. Once the via mask pattern is removed, a dielectric layer, e.g., a layer of a low-κ dielectric material, will then be formed on the wafer and then planarized using, for example, etchback or CMP processes, to remove the excess material and provide a substantially more planar surface for subsequent processing.

In operation 1408 a second mask pattern is formed to expose portions of the Mx metal pattern and an intervening region of the planarized ILD layer.

In operation 1410 a DoD ASD process is utilized to raise a dielectric structure that is precisely aligned with exposed portion(s) of the underlying ILD pattern on the wafer. In some embodiments, the height of the dielectric structure will exceed a plane defined by the upper surface of the second mask pattern.

In operation 1412, the second mask pattern is modified or, in some embodiments, removed and another mask layer deposited, to form a third mask pattern. The third mask pattern is configured to expose more of the wafer surface surrounding the dielectric structure and corresponds to a Mx+1 metal pattern.

In operation 1414 the Mx+1 metal layer is formed on the third mask pattern and planarized to form the Mx+1 metal pattern. In some embodiments, the third mask pattern is then removed and an additional ILD material layer is formed on the wafer. In some embodiments, the wafer is then planarized to define a wafer surface comprising the upper surfaces of the Mx+1 metal pattern and the dielectric material insulating the various conductive elements of the Mx+1 metal pattern from each other.

In optional operation 1416 the planarized wafer comprising an aligned Mx metal pattern/via stack and a Mx+1 metal pattern is transferred to additional BEOL operations to complete the manufacture of the IC device.

Figure 15:
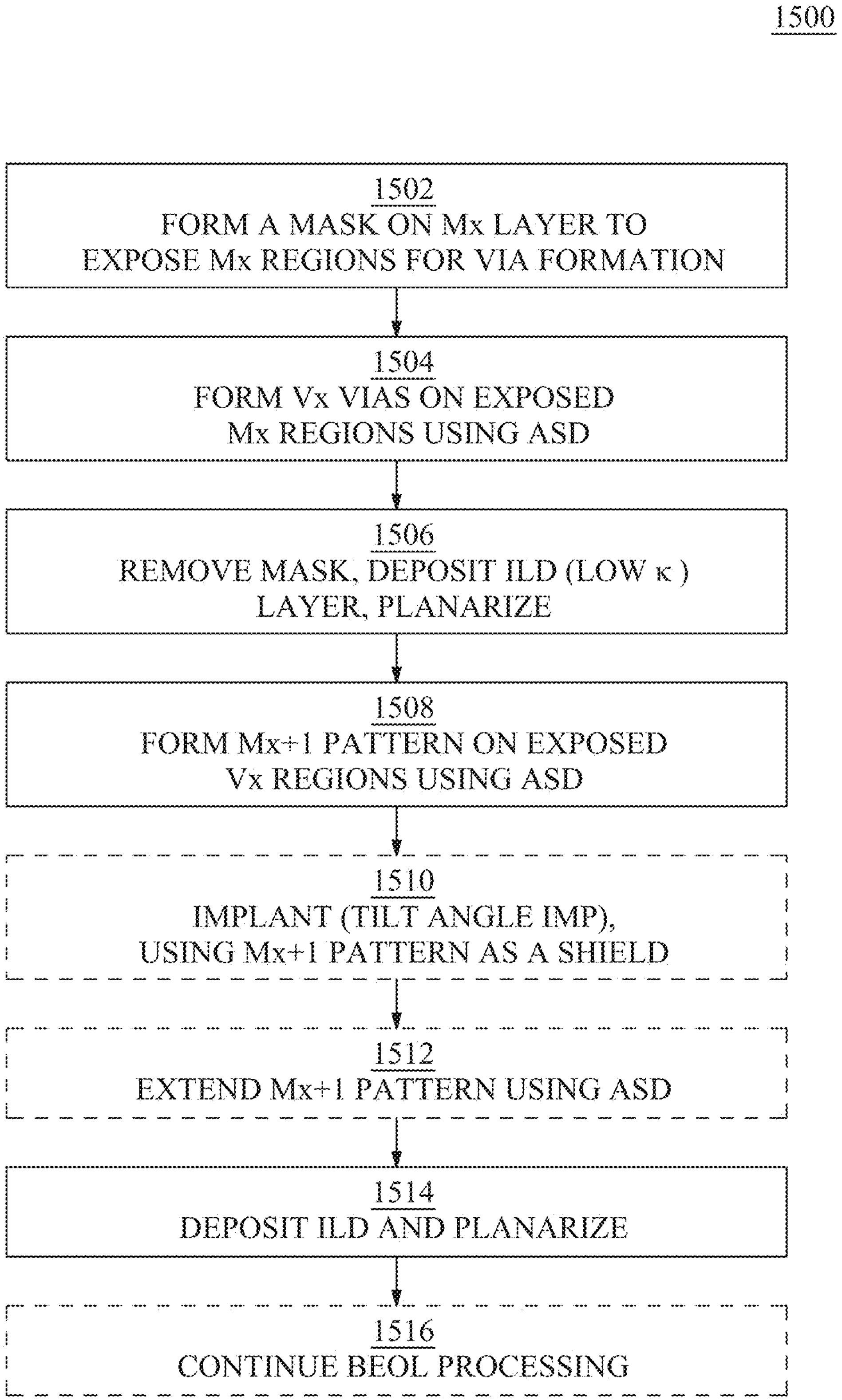
FIG. 15 is a flowchart of a manufacturing process for the production of IC devices according to some embodiments.

FIG. 15 is a flowchart of a manufacturing process 1500 for the production of IC devices according to some embodiments including, for example, some embodiments of the IC devices shown in FIGS. 4A-4H and FIGS. 6A-6H). In operation 1502 the wafer is processed to form a first metal pattern, Mx metal pattern, after which a first mask pattern (hard mask or HM) is applied to the Mx metal pattern to expose those regions of the Mx metal pattern on which the vias are to be constructed.

In operation 1504 the exposed portions of the Mx metal pattern are utilized as the base for further processing using a MoM ASD to form a plurality of via structures. Using the ASD process allows the via structures to be precisely aligned with the Mx metal pattern because the growth of the via structures is limited to those exposed portions of the Mx metal pattern. By using the ASD process, the manufacturer avoids using a more traditional damascene process in which a substantial amount of material must be deposited and removed in order to obtain the via pattern.

In operation 1506 the first mask pattern is removed, an ILD layer is formed on the wafer and the wafer is planarized to provide a wafer surface with top surfaces of the via structures exposed and separated from each other by the ILD.

In operation 1508 a second mask pattern is formed on the wafer to expose the top surfaces of the via structures and portions of the top surface of the ILD layer. A MOM ASD process is then used to form a first portion of the Mx+1 metal pattern extending upwardly from the exposed surfaces of the via structure.

In optional operation 1510 the first Mx+1 metal pattern is used as an implant mask during a tilt angle implant to form an implant exclusion zone that extends between adjacent portions of the Mx+1 metal pattern. During the implant operation the first Mx+1 metal pattern "shadows" the implant exclusion zone from the beam of ions being directed at the wafer surface at a non-zero "tilt" angle. Depending on the implant species, the implant energy, and the implant dosage, in some embodiments surface portions of the ILD layer that are exposed by the second mask pattern and not within the implant exclusion zone will exhibit altered electrical properties and/or become more or less receptive to a subsequent ASD process.

In optional operation 1512 the configuration of the Mx+1 metal pattern is altered using a MoM ASD process to increase the width and/or thickness of the Mx+1 metal pattern through the addition of a second portion of the Mx+1 metal pattern. In some embodiments the ILD surface adjacent the first portion of the Mx+1 metal pattern will have been modified during the tilt angle implant to become more receptive to the application of conductive materials using the ASD process. In some embodiments, the conditions of the ASD process are altered to provide for application of conductive materials to both the conductive and dielectric surfaces exposed by the second mask pattern.

In operation 1514 the second mask pattern is removed and an additional ILD material layer is formed on the wafer. In some embodiments, the wafer is then planarized to define a wafer surface comprising the upper surfaces of the Mx+1 metal pattern and the dielectric material insulating the various conductive elements of the Mx+1 metal pattern from each other.

In optional operation 1516 the planarized wafer comprising an aligned Mx metal pattern/via/Mx+1 metal pattern stack is transferred to additional BEOL operations to complete the manufacture of the IC device.

Figure 16:
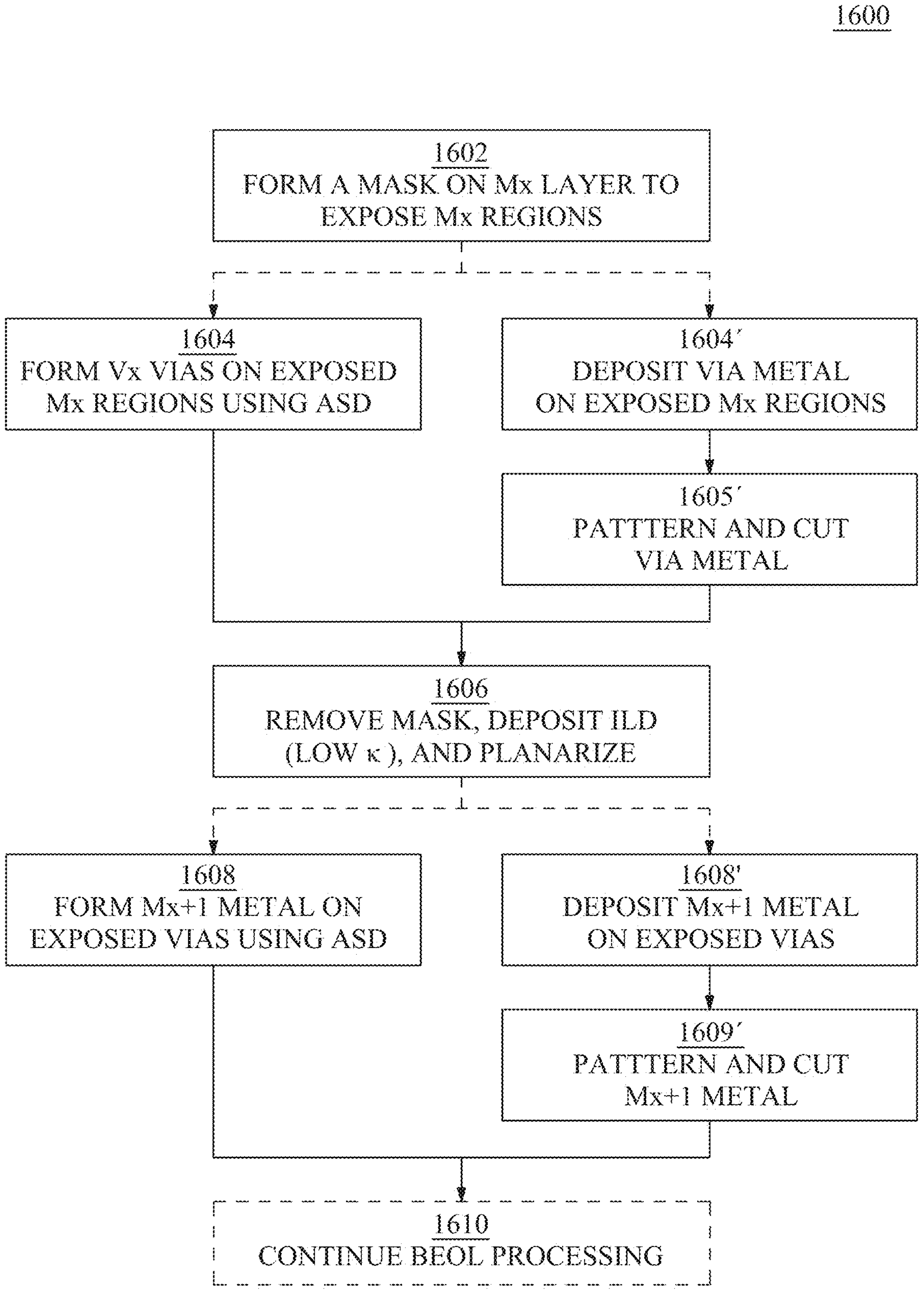
FIG. 16 is a flowchart of a manufacturing process for the production of IC devices according to some embodiments.

FIG. 16 is a flowchart of a manufacturing process 1600 for the production of IC devices according to some embodiments including, for example, some embodiments of the IC devices shown in FIGS. 4A-4H and FIGS. 6A-6H). In operation 1602 the wafer is processed to form a first metal pattern, Mx metal pattern, after which a first mask pattern (hard mask or HM) is applied to the Mx metal pattern to expose those regions of the Mx metal pattern on which the vias are to be constructed. After completion of operation 1602, the wafer will be processed using an ASD process for forming vias on the exposed surfaces of the Mx metal pattern or will be processed using an alternative cut metal process.

In operation 1604, the exposed portions of the Mx metal pattern are utilized as the base for further processing using a MoM ASD to form a plurality of via structures. Using the ASD process allows the via structures to be precisely aligned with the Mx metal pattern because the growth of the via structures is limited to those exposed portions of the Mx metal pattern. By using the ASD process, the manufacturer avoids using a more traditional damascene process in which a substantial amount of material must be deposited and removed in order to obtain the via pattern.

Alternatively, in operation 1604' a dielectric layer is formed on the wafer and a via pattern is opened in the dielectric layer. The conductive material layer from which the vias are formed is then deposited on the via pattern and the wafer is planarized to separate the via pattern structures from the overlying conductive material. In operation 1605' a cut metal pattern is formed to expose those portions of the via pattern structures that are to be removed during the cut metal etch. An etch process is then used to remove the exposed portions of the via pattern structures.

After completion of operation 1604 or 1605' operation 1606 is conducted during with the hard and/or soft masks are removed from the wafer, an ILD layer is deposited on the wafer, and the wafer is planarized to expose the upper surfaces of the vias in preparation for the next operation.

In operation 1608 a Mx+1 metal pattern is formed using a MoM ASD process whereby the Mx+1 metal pattern is selectively formed on the exposed upper surfaces of the vias.

Alternatively, in operation 1608' an ILD layer is deposited, patterned, and etched to form a Mx+1 metal pattern. A Mx+1 metal layer is then deposited on the etched ILD layer and an upper portion is removed to complete the initial Mx+1 metal pattern. In operation 1609' a cut metal pattern is formed to expose those portions of the Mx+1 metal pattern structures that are to be removed during the cut metal etch. An etch process is then used to remove the exposed portions of the Mx+1 metal pattern to, for example, define a plurality of distinct conductive nets on the wafer.

After completion of operation 1608 or 1609', in optional operation 1610 the planarized wafer comprising an aligned Mx metal pattern/via/Mx+1 metal pattern stack is transferred to additional BEOL operations to complete the manufacture of the IC device.

The disclosed methods and structures provide an improved solution for BEOL landing issues associated with the formation of a Mx metal pattern 202, a via 204 pattern Vx corresponding and providing electrical connection to the first metal pattern, and a Mx+1 metal pattern 208 corresponding to the via pattern and providing electrical connection, through the vias, to the first metal pattern. In some embodiments, a MoM ASD operation allows for a reduced via 204 Vx minimum pitch and allows for a complete, zero-offset, landing on the terminal portions of the Mx metal pattern 202 while maintaining a minimum or close to minimum allowable E2E spacing between adjacent terminal elements of the Mx+1 metal pattern 208.

In some embodiments, combining the ASD operation with an ion metal plasma (IMP) operation provides a no cut and zero enclosure process for applying the second metal layer Mx+1 to the underlying via pattern Vx. In some embodiments, the combination of a low-k dielectric layer 203' (LK) and ASD operations provides for a cut metal Mx+1 pattern that provides for zero-offset enclosure and freedom of Mx+1 length feature. In some embodiments, the ASD operation(s) provide for a reduced series of operations for achieving improved conductive structures when compared to photolithography-based methods and/or self-aligned contact (SAC) based methods.

Figure 17:
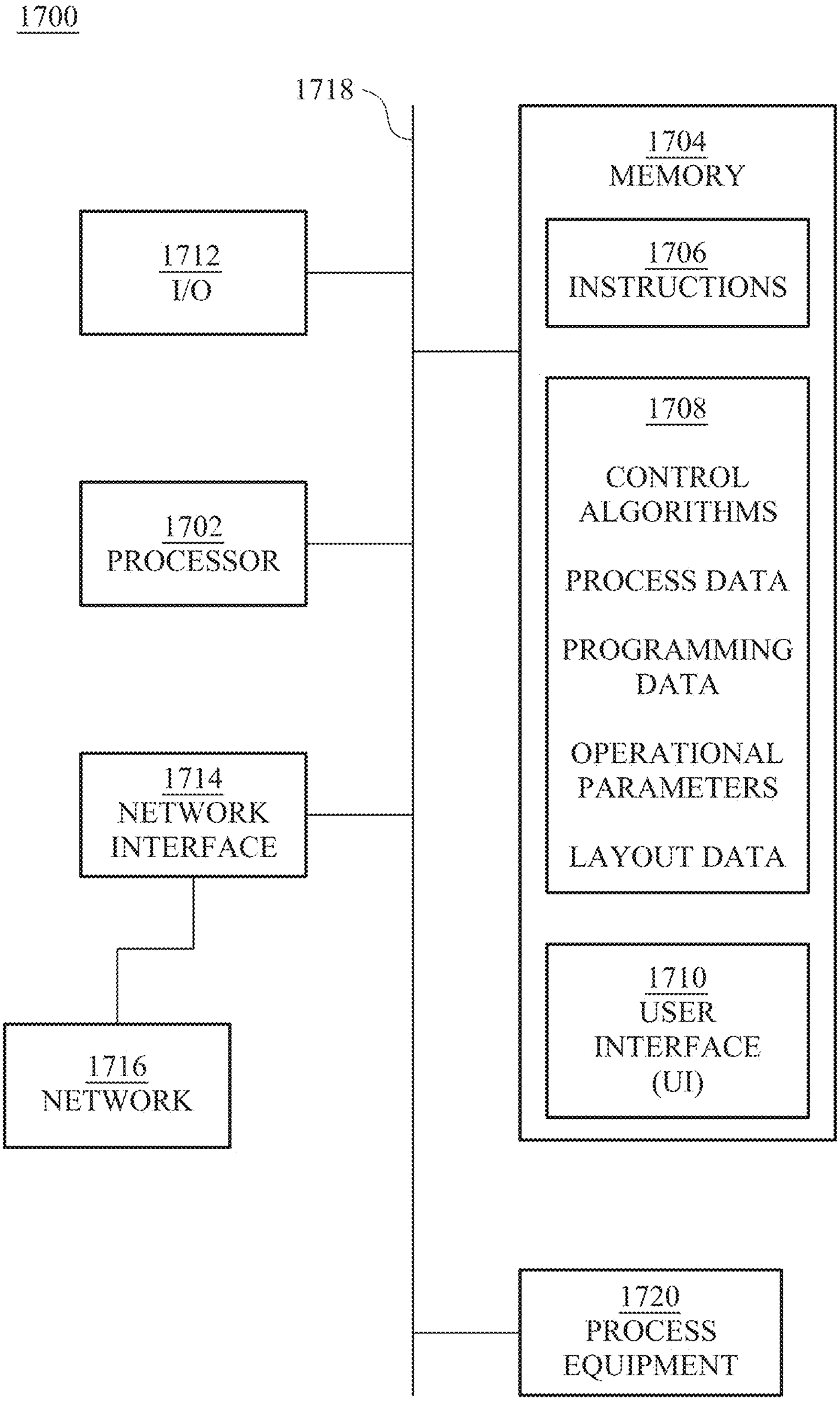
FIG. 17 is a schematic diagram of a system for manufacturing FET devices according to some embodiments.

FIG. 17 is a block diagram of an electronic process control (EPC) system 1700, in accordance with some embodiments. Methods used for generating cell layout diagrams corresponding to some embodiments of the FET device structures detailed above, particularly with respect to the addition and placement of the electrical contacts, thermal contacts, active metal patterns, dummy metal patterns, and other heat dissipating structures may be implemented, for example, using EPC system 1700, in accordance with some embodiments of such systems.

In some embodiments, EPC system 1700 is a general purpose computing device including a hardware processor 1702 and a non-transitory, computer-readable, storage medium 1704. Computer-readable storage medium 1704, amongst other things, is encoded with, i.e., stores, computer program code (or instructions) 1706, i.e., a set of executable instructions. Execution of computer program code 1706 by hardware processor 1702 represents (at least in part) an EPC tool which implements a portion or all of, e.g., the methods described herein in accordance with one or more (hereinafter, the noted processes and/or methods).

Hardware processor 1702 is electrically coupled to computer-readable storage medium 1704 via a bus 1718. Hardware processor 1702 is also electrically coupled to an I/O interface 1712 by bus 1718. A network interface 1714 is also electrically connected to hardware processor 1702 via bus 1718. Network interface 1714 is connected to a network 1716, so that hardware processor 1702 and computer-readable storage medium 1704 are capable of connecting to external elements via network 1716. Hardware processor 1702 is configured to execute computer program code 1706 encoded in computer-readable storage medium 1704 in order to cause the EPC system 1700 to be usable for performing a portion or all of the noted processes and/or methods. In one or more embodiments, hardware processor 1702 is a central processing unit (CPU), a multi-processor, a distributed processing system, an application specific integrated circuit (ASIC), and/or a suitable processing unit.

In one or more embodiments, computer-readable storage medium 1704 is an electronic, magnetic, optical, electromagnetic, infrared, and/or a semiconductor system (or apparatus or device). For example, computer-readable storage medium 1704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1704 includes a compact disk-read only memory (CD-ROM), a compact disk-read/write (CD-R/W), and/or a digital video disc (DVD).

In one or more embodiments, computer-readable storage medium 1704 stores computer program code 1706 configured to cause the EPC system 1700 (where such execution represents (at least in part) the EPC tool) to be usable for performing a portion or all of the noted processes and/or methods. In one or more embodiments, computer-readable storage medium 1704 also stores information which facilitates performing a portion or all of the noted processes and/or methods. In one or more embodiments, computer-readable storage medium 1704 stores process control data 1708 including, in some embodiments, control algorithms, process variables and constants, target ranges, set points, programming control data, and code for enabling statistical process control (SPC) and/or model predictive control (MPC) based control of the various processes.

EPC system 1700 includes I/O interface 1712. I/O interface 1712 is coupled to external circuitry. In one or more embodiments, I/O interface 1712 includes a keyboard, keypad, mouse, trackball, trackpad, touchscreen, and/or cursor direction keys for communicating information and commands to hardware processor 1702.

EPC system 1700 also includes network interface 1714 coupled to hardware processor 1702. Network interface 1714 allows EPC system 1700 to communicate with network 1716, to which one or more other computer systems are connected. Network interface 1714 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EPC systems 1700.

EPC system 1700 is configured to send information to and receive information from fabrication tools 1720 that include one or more of ion implant tools, etching tools, deposition tools, coating tools, rinsing tools, cleaning tools, chemical-mechanical planarizing (CMP) tools, testing tools, inspection tools, transport system tools, and thermal processing tools that will perform a predetermined series of manufacturing operations to produce the desired integrated circuit devices. The information includes one or more of operational data, parametric data, test data, and functional data used for controlling, monitoring, and/or evaluating the execution, progress, and/or completion of the specific manufacturing process. The process tool information is stored in and/or retrieved from computer-readable storage medium 1704.

EPC system 1700 is configured to receive information through I/O interface 1712. The information received through I/O interface 1712 includes one or more of instructions, data, programming data, design rules that specify, e.g., layer thicknesses, spacing distances, structure and layer resistivity, and feature sizes, process performance histories, target ranges, set points, and/or other parameters for processing by hardware processor 1702. The information is transferred to hardware processor 1702 via bus 1718. EPC system 1700 is configured to receive information related to a user interface (UI) through I/O interface 1712. The information is stored in computer-readable medium 1704 as user interface (UI) 1710.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EPC tool. In some embodiments, a portion or all of the noted processes and/or methods is implemented as a software application that is used by EPC system 1700.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 18:
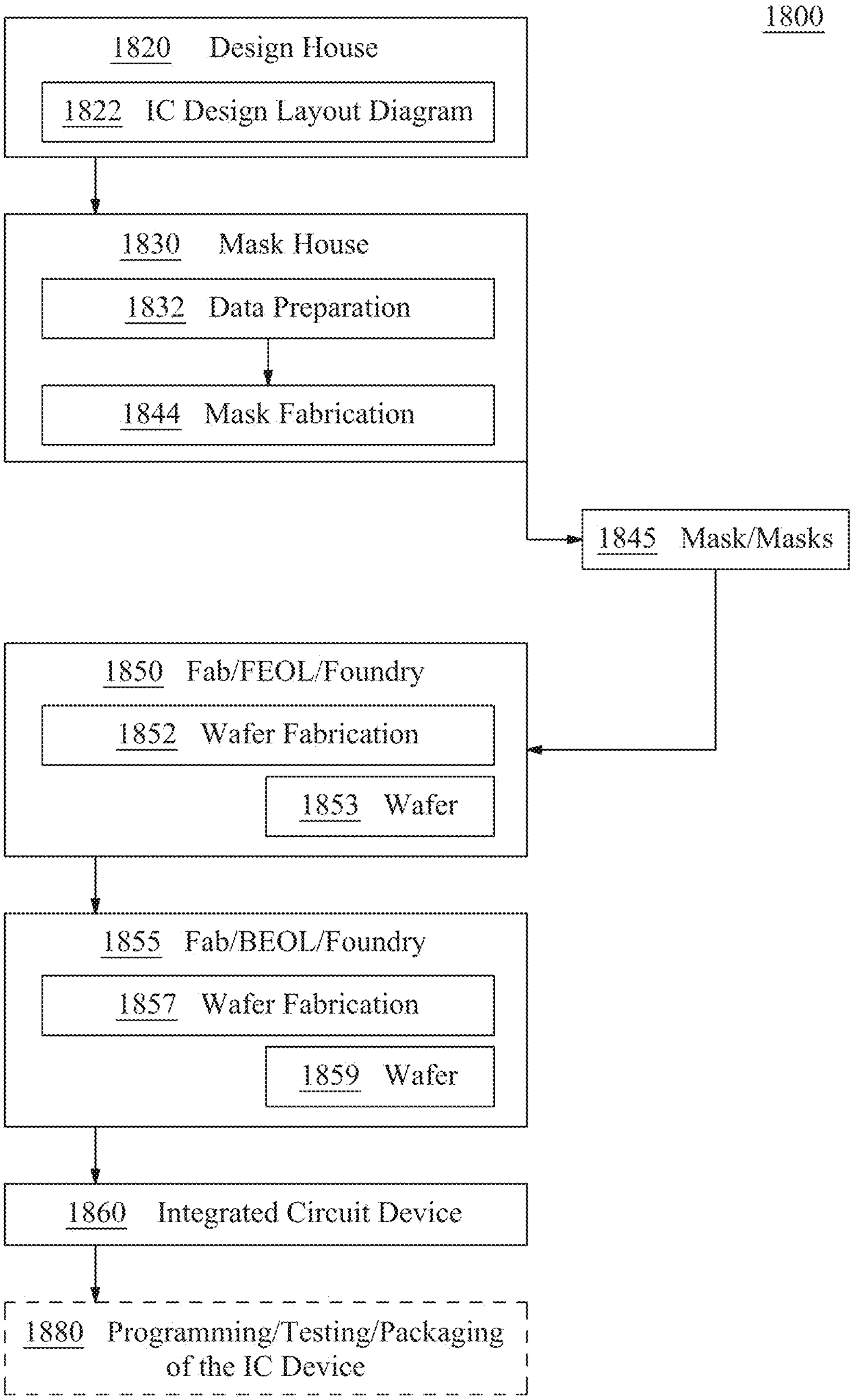
FIG. 18 is a flowchart of IC device design, manufacture, and programming of IC devices according to some embodiments.

FIG. 18 is a block diagram of an integrated circuit (IC) manufacturing system 1800, and an IC manufacturing flow associated therewith, in accordance with some embodiments for manufacturing IC devices that incorporate the improved control over the SSD and EPI profile. In some embodiments, based on a layout diagram, at least one of (A) one or more semiconductor masks or (B) at least one component in a layer of a semiconductor integrated circuit is fabricated using manufacturing system 1800.

In FIG. 18, IC manufacturing system 1800 includes entities, such as a design house 1820, a mask house 1830, and an IC manufacturer/fabricator ("fab") 1850, that interact with one another in the design, development, and manufacturing cycles and/or services related to manufacturing an IC device 1860. Once the manufacturing process has been completed to form a plurality of IC devices on a wafer, the wafer is optionally sent to backend or back end of line (BEOL) 1880 for, depending on the device, programming, electrical testing, and packaging in order to obtain the final IC device products. The entities in manufacturing system 1800 are connected by a communications network. In some embodiments, the communications network is a single network. In some embodiments, the communications network is a variety of different networks, such as an intranet and the Internet.

The communications network includes wired and/or wireless communication channels. Each entity interacts with one or more of the other entities and provides services to and/or receives services from one or more of the other entities. In some embodiments, two or more of design house 1820, mask house 1830, and IC Fab 1850 is owned by a single larger company. In some embodiments, two or more of design house 1820, mask house 1830, and IC Fab 1850 coexist in a common facility and use common resources.

Design house (or design team) 1820 generates an IC design layout diagram 1822. IC design layout diagram 1822 includes various geometrical patterns designed for an IC device 1860. The geometrical patterns correspond to patterns of metal, oxide, or semiconductor layers that make up the various components of IC device 1860 to be fabricated. The various layers combine to form various IC features.

For example, a portion of IC design layout diagram 1822 includes various IC features, such as an active region, gate electrode, source and drain, metal lines or vias of an intermetal interconnection, and openings for bonding pads, to be formed in a semiconductor substrate (such as a silicon wafer) and various material layers disposed on the semiconductor substrate. Design house 1820 implements a proper design procedure to form IC design layout diagram 1822. The design procedure includes one or more of logic design, physical design or place and route. IC design layout diagram 1822 is presented in one or more data files having information of the geometrical patterns. For example, IC design layout diagram 1822, in some operations, will be expressed in a GDSII file format or DFII file format.

Whereas the pattern of a modified IC design layout diagram is adjusted by an appropriate method in order to, for example, reduce parasitic capacitance of the integrated circuit as compared to an unmodified IC design layout diagram, the modified IC design layout diagram reflects the results of changing positions of conductive line in the layout diagram, and, in some embodiments, inserting to the IC design layout diagram, features associated with capacitive isolation structures to further reduce parasitic capacitance, as compared to IC structures having the modified IC design layout diagram without features for forming capacitive isolation structures located therein.

Mask house 1830 includes mask data preparation 1832 and mask fabrication 1844. Mask house 1830 uses IC design layout diagram 1822 to manufacture one or more masks 1845 to be used for fabricating the various layers of IC device 1860 according to IC design layout diagram 1822. Mask house 1830 performs mask data preparation 1832, where IC design layout diagram 1822 is translated into a representative data file ("RDF"). Mask data preparation 1832 provides the RDF to mask fabrication 1844. Mask fabrication 1844 includes a mask writer. A mask writer converts the RDF to an image on a substrate, such as a mask (reticle) 1845 or a semiconductor wafer 1853. The IC design layout diagram 1822 is manipulated by mask data preparation 1832 to comply with particular characteristics of the mask writer and/or requirements of IC Fab 1850. In FIG. 18, mask data preparation 1832 and mask fabrication 1844 are illustrated as separate elements. In some embodiments, mask data preparation 1832 and mask fabrication 1844 are collectively referred to as mask data preparation.

In some embodiments, mask data preparation 1832 includes optical proximity correction (OPC) which uses lithography enhancement techniques to compensate for image errors, such as those that are known to arise from diffraction, interference, other process effects and the like. OPC adjusts IC design layout diagram 1822. In some embodiments, mask data preparation 1832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1832 includes a mask rule checker (MRC) that checks the IC design layout diagram 1822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1822 to compensate for limitations during mask fabrication 1844, which may undo part of the modifications performed by OPC in order to meet mask creation rules.

In some embodiments, mask data preparation 1832 includes lithography process checking (LPC) that simulates processing that will be implemented by IC Fab 1850 to fabricate IC device 1860. LPC simulates this processing based on IC design layout diagram 1822 to create a simulated manufactured device, such as IC device 1860. In some embodiments, the processing parameters in LPC simulation will include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1822.

It should be understood that the above description of mask data preparation 1832 has been simplified for the purposes of clarity. In some embodiments, mask data preparation 1832 includes additional features such as a logic operation (LOP) to modify the IC design layout diagram 1822 according to manufacturing rules. Additionally, the processes applied to IC design layout diagram 1822 during mask data preparation 1832 may be executed in a variety of different orders.

After mask data preparation 1832 and during mask fabrication 1844, a mask 1845 or a group of masks 1845 are fabricated based on the modified IC design layout diagram 1822. In some embodiments, mask fabrication 1844 includes performing one or more lithographic exposures based on IC design layout diagram 1822. In some embodiments, an electron-beam (e-beam) or a mechanism of multiple e-beams is used to form a pattern on a mask (photomask or reticle) 1845 based on the modified IC design layout diagram 1822. Mask 1845 will be formed using a process selected from various available technologies. In some embodiments, mask 1845 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1845 includes a transparent substrate (e.g., fused quartz) and an opaque material (e.g., chromium) coated in the opaque regions of the binary mask.

In another example, mask 1845 is formed using a phase shift technology. In a phase shift mask (PSM) version of mask 1845, various features in the pattern formed on the phase shift mask are configured to have proper phase difference to enhance the resolution and imaging quality. In various examples, the phase shift mask will be attenuated PSM or alternating PSM. The mask(s) generated by mask fabrication 1844 is used in a variety of processes. For example, such a mask(s) is used in an ion implantation process to form various doped regions in semiconductor wafer 1853, in an etching process to form various etching regions in semiconductor wafer 1853, and/or in other suitable processes.

IC Fab 1850 includes wafer fabrication 1852. IC Fab 1850 is an IC fabrication business that includes one or more manufacturing facilities for the fabrication of a variety of different IC products. In some embodiments, IC Fab 1850 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

Wafer fabrication 1852 includes forming a patterned layer of mask material formed on a semiconductor substrate is made of a mask material that includes one or more layers of photoresist, polyimide, silicon oxide, silicon nitride (e.g., $Si_3N_4$, SiON, SiC, SiOC), or combinations thereof. In some embodiments, masks 1845 include a single layer of mask material. In some embodiments, a mask 1845 includes multiple layers of mask materials.

In some embodiments IC Fab 1855 includes wafer fabrication 1857. IC Fab 1855 is an IC fabrication business that includes one or more manufacturing facilities for the fabrication of a variety of different IC products. In some embodiments, IC Fab 1855 is a manufacturing facility provide the back end fabrication for the interconnection and packaging of the IC products (back-end-of-line (BEOL) fabrication) to add one or more metallization layers to wafer 1859, and a third manufacturing facility (not shown) may provide other services for the foundry business such as packaging and labelling.

In some embodiments, the mask material is patterned by exposure to an illumination source. In some embodiments, the illumination source is an electron beam source. In some embodiments, the illumination source is a lamp that emits light. In some embodiments, the light is ultraviolet light. In some embodiments, the light is visible light. In some embodiments, the light is infrared light. In some embodiments, the illumination source emits a combination of different (UV, visible, and/or infrared) light.

In some embodiments, etching processes include presenting the exposed structures in the functional area(s) to an oxygen-containing atmosphere to oxidize an outer portion of the exposed structures, followed by a chemical trimming process such as plasma-etching or liquid chemical etching, as described above, to remove the oxidized material and leave behind a modified structure. In some embodiments, oxidation followed by chemical trimming is performed to provide greater dimensional selectivity to the exposed material and to reduce a likelihood of accidental material removal during a manufacturing process. In some embodiments, the exposed structures may include the fin structures of Fin Field Effect Transistors (FinFET) with the fins being embedded in a dielectric support medium covering the sides of the fins. In some embodiments, the exposed portions of the fins of the functional area are top surfaces and sides of the fins that are above a top surface of the dielectric support medium, where the top surface of the dielectric support medium has been recessed to a level below the top surface of the fins, but still covering a lower portion of the sides of the fins.

Subsequent to mask patterning operations, areas not covered by the mask are etched to modify a dimension of one or more structures within the exposed area(s). In some embodiments, the etching is performed using plasma etching, reactive ion etching (RIE), or a liquid chemical etch solution, according to some embodiments. The chemistry of the liquid chemical etch solution includes one or more of etchants such as citric acid ($C_6H_8O_7$), hydrogen peroxide ($H_2O_2$), nitric acid ($HNO_3$), sulfuric acid ($H_2SO_4$), hydrochloric acid (HCl), acetic acid ($CH_3CO_2H$), hydrofluoric acid (HF), buffered hydrofluoric acid (BHF), phosphoric acid ($H_3PO_4$), ammonium fluoride ($NH_4F$) potassium hydroxide (KOH), ethylenediamine pyrocatechol (EDP), TMAH (tetramethylammonium hydroxide), or a combination thereof.

In some embodiments, the etching process is a dry-etch or plasma etch process. Plasma etching of a substrate material is performed using halogen-containing reactive gasses excited by an electromagnetic field to dissociate into ions. Reactive or etchant gases include, for example, $CF_4$, $SF_6$, $NF_3$, $Cl_2$, $CCl_2F_2$, $SiCl_4$, $BCl_2$, or a combination thereof, although other semiconductor-material etchant gases are also envisioned within the scope of the present disclosure. Ions are accelerated to strike exposed material by alternating electromagnetic fields or by fixed bias according to methods of plasma etching that are known in the art.

In some embodiments, molecular level processing technologies that share the self-limiting surface reaction characteristics utilized in ALD including, for example, Molecular Layer Deposition (MLD) and Self-Assembled Monolayers (SAM). MLD utilizes successive precursor-surface reactions in which a precursor is introduced into a reaction zone above the wafer surface. The precursor adsorbs to the wafer surface where it is confined by physisorption. The precursor then undergoes a quick chemisorption reaction with a number of active surface sites, leading to the self-limiting formation of molecular attachments in specific assemblies or regularly recurring structures. These MLD structures will be formed successfully using lower process temperatures than some traditional deposition techniques.

SAM is a deposition technique that involves the spontaneous adherence of organized organic structures on a wafer surface. This adherence involves adsorption of the organic structures from the vapor or liquid phase utilizing relatively weak interactions with the wafer surface. Initially, the structures are adsorbed on the surface by physisorption through, for instance, van der Waals forces or polar interactions. The self-assembled monolayers will then become confined to the surface by a chemisorption process. In some embodiments, the ability of SAM to grow layers as thin as a single molecule through chemisorption-driven interactions with the wafer surface(s) will be particularly useful in forming thin films including, for example, "near-zero-thickness" activation or barrier layers. SAM will also be particularly useful in area-selective deposition (ASD) (or area-specific deposition) using molecules that exhibit preferential reactions with specific segments of the underlying wafer surface in order to facilitate or obstruct subsequent material growth in the targeted areas. In some embodiments, SAM is used to form a foundation or blueprint region for subsequent area-selective ALD (AS-ALD) or area-selective CVD (AS-CVD).

The ALD, MLD, and SAM processes represent viable options for manufacturing thin layers (in some embodiments, the manufactured layers are only few atoms thick) that exhibit sufficient uniformity, conformality, and/or purity for the intended IC device application. By delivering the constituents of the material systems being manufactured both individually and sequentially into the processing environment, these processes and the precise control of the resulting surface chemical reactions allow for excellent control of processing parameters and the target composition and performance of the resulting film(s).

Figure 19:
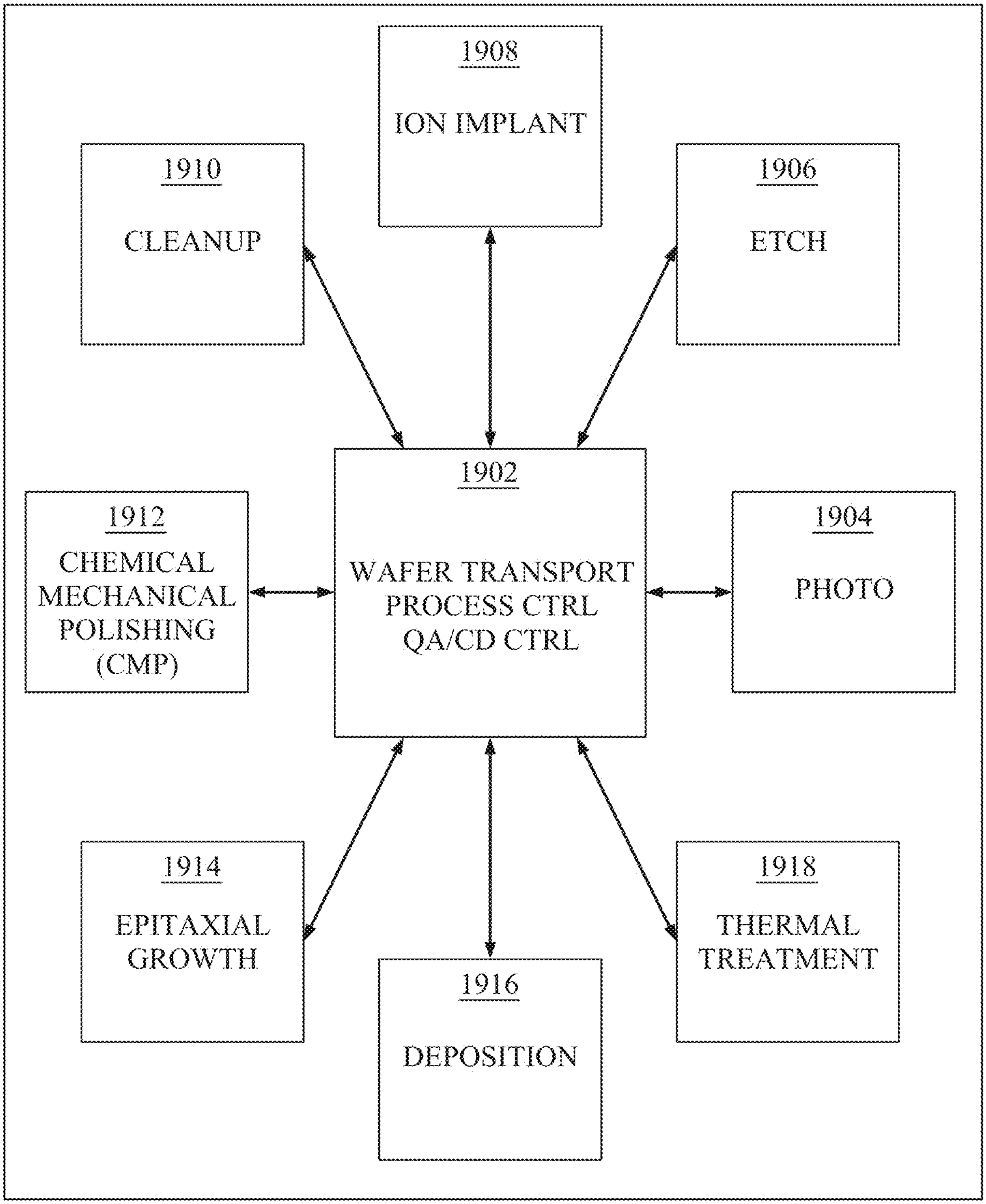
FIG. 19 is a schematic diagram of a processing system for manufacturing of IC devices according to some embodiments.

FIG. 19 is a schematic diagram of various processing departments defined within a Fab/Front End/Foundry for manufacturing IC devices according to some embodiments. The processing departments utilized in both front end of line (FEOL) and back end of line (BEOL) IC device manufacturing typically include a wafer transport operation 1902 for moving the wafers between the various processing departments. In some embodiments, the wafer transport operation will be integrated with an electronic process control (EPC) system according to FIG. 17 and utilized for providing process control operations, ensuring that the wafers being both processed in a timely manner and sequentially delivered to the appropriate processing departments as determined by the process flow. In some embodiments, the EPC system will also provide control and/or quality assurance and parametric data for the proper operation of the defined processing equipment. Interconnected by the wafer transport operation 1902 will be the various processing departments providing, for example, photolithographic operations 1904, etch operations 1906, ion implant operations 1908, clean-up/strip operations 1910, chemical mechanical polishing (CMP) operations 1912, epitaxial growth operations 1914, deposition operations 1916, and thermal treatments 1918.

According to some embodiments methods for manufacturing an integrated circuit device include the operations of depositing a first metal pattern on a semiconductor substrate, depositing a first via on a first portion of a first conductive line of the first metal pattern using an area selective deposition, depositing a second via on a second portion of an adjacent second conductive line of the first metal pattern using the area selective deposition, the first and second vias being formed simultaneously and separated by a first region of dielectric material, wherein the first and second vias are separated by a minimum edge-to-edge spacing, and depositing a first portion of a second metal pattern on the first and second vias using a second area selective deposition to form a first metal pattern/via/second metal stack with no edge offset.

Some embodiments of the methods for manufacturing integrated circuit device also include one or more additional operations including, for example, depositing a first mask pattern that exposes surface portions of the first and second vias, performing a tilt angle implant on the semiconductor substrate, wherein adjacent portions of the second metal pattern define an implant exclusion region between the adjacent portions of the second metal pattern, forming a second portion of the second metal pattern using a third area selective deposition, forming a second portion of the second metal pattern using a non-area selective metal deposition, forming a second portion of the second metal pattern using a non-area selective metal deposition, forming a cut metal pattern to expose a target region of the second metal pattern, and removing the target region from the second metal pattern, forming the first via and the second via with an end-to-end spacing no greater than 150% of a minimum end-to-end spacing permitted by an end-to-end spacing rule for design of the integrated circuit device, forming the first via and the second via with an end-to-end spacing no greater than 20 nm, and/or forming a first mask pattern on the first metal pattern, wherein the first mask pattern exposes the first portion on the first conductive line and the second portion of the second conductive line in a single opening, and forming the first via and the second via to have a substantially trapezoidal edge configuration.

According to some embodiments methods for manufacturing an integrated circuit device include the operations of forming a first conductive line having a first end over a semiconductor substrate, forming a second conductive line having a second end over the semiconductor substrate, wherein the first end and the second end are separated by a dielectric material, forming a mask pattern over the first conductive line and the second conductive line, the mask pattern exposing the first conductive line, the second conductive line and the dielectric material, and performing a first area selective deposition (ASD) of conductive material on only the exposed portions of the first and second conductive lines to form only a first via on the first conductive line adjacent the first end, and a second via on the second conductive line adjacent the second end.

Some embodiments of the methods for manufacturing integrated circuit device also include one or more additional operations including, for example, aligning a first wall of the first via with a first wall of the first end, aligning a first wall of the second via with a first wall of the second end, aligning the first via with the first conductive line and aligning the second via with the second conductive line to form conductive line/via zero enclosure assemblies, depositing a dielectric material over the first and second vias and planarizing the dielectric material to expose upper surfaces of the first and second vias and a portion of the dielectric material separating the first and second vias, forming a second mask pattern that exposes portions of the upper surfaces of the first and second vias and the dielectric material separating the first and second vias, performing a second area selective deposition (ASD) of dielectric material to form a dielectric structure, forming a third mask pattern that exposes the dielectric structure and portions of the upper surfaces of the first and second vias, forming a metal layer over the semiconductor substrate, planarizing the metal layer to remove an upper portion of the metal layer and form a metal pattern over the first and second vias, forming a cut metal pattern over the metal pattern to expose a portion of the metal pattern between the first and second vias and/or removing the exposed portion of the metal pattern from between adjacent first and second vias.

According to some embodiments an integrated circuit device includes structures including a first metal pattern having a first metal sidewall, a first via having a first via sidewall over a first portion of the first metal pattern, a second metal pattern having a second metal sidewall over the first and second vias, wherein the first metal sidewall, the first via sidewall, and the second metal sidewall are aligned to form a zero enclosure conductive stack.

Some embodiments of an integrated circuit device also include one or more additional structures including, for example, a second via adjacent the first via wherein the first and second vias are separated by a distance corresponding to a minimum end-to-end spacing permitted by a spacing rule for design of the integrated circuit device, a second via adjacent the first via wherein the first and second vias are separated by a distance not greater than 20 nm, a third via separated from both the first and second vias by a distance not less than a one pattern/one etch (1P1E) extreme ultraviolet (EUV) pitch permitted by a spacing rule for design of the integrated circuit device, and/or first and second vias having a trapezoidal perimeter profile including a major base, a minor base, and two non-parallel legs, wherein the first and second vias are oriented with the major base of the first via opposite the major base of the second via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of some embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

We claim:

1. A method for manufacturing an integrated circuit device comprising:

depositing a first metal pattern on a semiconductor substrate;

depositing a first via on a first portion of a first conductive line of the first metal pattern using an area selective deposition, wherein the area selective deposition is free of a mask layer having an opening exposing only the first metal pattern;

depositing a second via on a second portion of an adjacent second conductive line of the first metal pattern using the area selective deposition, the first and second vias being formed simultaneously and separated by a first region of dielectric material, wherein the first and second vias are separated by a minimum edge-to-edge spacing;

depositing a first portion of a second metal pattern on the first and second vias using a second area selective deposition to form a first metal pattern/via/second metal stack with no edge offset; and depositing a dielectric material along a sidewall of the second via after depositing the second via.

2. The method for manufacturing an integrated circuit device according to claim 1, further comprising:

depositing a first mask pattern that exposes surface portions of the first and second vias.

3. The method for manufacturing an integrated circuit device according to claim 1, further comprising:

performing a tilt angle implant on the semiconductor substrate, wherein adjacent portions of the second metal pattern define an implant exclusion region between the adjacent portions of the second metal pattern.

4. The method for manufacturing an integrated circuit device according to claim 1, further comprising:

forming a second portion of the second metal pattern using a third area selective deposition.

5. The method for manufacturing an integrated circuit device according to claim 1, further comprising:

forming a second portion of the second metal pattern using a non-area selective metal deposition.

6. The method for manufacturing an integrated circuit device according to claim 1, further comprising:

forming a second portion of the second metal pattern using a non-area selective metal deposition;

forming a cut metal pattern to expose a target region of the second metal pattern; and removing the target region from the second metal pattern.

7. The method for manufacturing an integrated circuit device according to claim 1, further comprising:

forming the first via and the second via with an end-to-end spacing no greater than 150% of a minimum end-to-end spacing permitted by an end-to-end spacing rule for design of the integrated circuit device.

8. The method for manufacturing an integrated circuit device according to claim 1, further comprising:

forming the first via and the second via with an end-to-end spacing no greater than 20 nm.

9. The method for manufacturing an integrated circuit device according to claim 1, further comprising:

forming a first mask pattern on the first metal pattern, wherein the first mask pattern exposes the first portion and the second portion of the first conductive line in a single opening; and forming the first via and the second via to have a substantially trapezoidal edge configuration.

10. A method of manufacturing a semiconductor device, comprising:

forming a first conductive line having a first end over a semiconductor substrate;

forming a second conductive line having a second end over the semiconductor substrate, wherein the first end and the second end are separated by a dielectric material;

forming a mask pattern over the first conductive line and the second conductive line, the mask pattern to define a single opening exposing each of the first conductive line, the second conductive line and the dielectric material; and performing a first area selective deposition (ASD) of conductive material on only the exposed portions of the first and second conductive lines to form only a first via on the first conductive line adjacent the first end, and a second via on the second conductive line adjacent the second end, wherein the first ASD of the conductive material confines growth of the first via to align a first wall of the first via with a first wall of the first end, and to align a first wall of the second via with a first wall of the second end.

11. The method of manufacturing a semiconductor device according to claim 10, further comprising:

performing a second ASD of conductive material on only exposed upper surfaces of the first and second vias to form a metal pattern, wherein the second ASD confines growth of the metal pattern to align a first wall of the metal pattern with the first wall of the first via and the first wall of the first end to form a zero enclosure conductive stack.

12. The method of manufacturing a semiconductor device according to claim 10, further comprising:

aligning the first via with the first conductive line; and aligning the second via with the second conductive line to form conductive line/via zero enclosure assemblies.

13. The method of manufacturing a semiconductor device according to claim 10, further comprising:

depositing a dielectric material over the first and second vias; and planarizing the dielectric material to expose upper surfaces of the first and second vias and a portion of the dielectric material separating the first and second vias.

14. The method of manufacturing a semiconductor device according to claim 13, further comprising:

forming a second mask pattern that exposes portions of the upper surfaces of the first and second vias and the dielectric material separating the first and second vias; and performing a second area selective deposition (ASD) of dielectric material to form a dielectric structure.

15. The method of manufacturing a semiconductor device according to claim 14, further comprising:

forming a third mask pattern that exposes the dielectric structure and portions of the upper surfaces of the first and second vias;

forming a metal layer over the semiconductor substrate; and planarizing the metal layer to remove an upper portion of the metal layer and form a metal pattern over the first and second vias.

16. The method of manufacturing a semiconductor device according to claim 15, further comprising:

forming a cut metal pattern over the metal pattern to expose a portion of the metal pattern between the first and second vias; and removing the exposed portion of the metal pattern from between adjacent first and second vias.

17. A method for manufacturing an integrated circuit device comprising:

depositing a first metal pattern on a semiconductor substrate, wherein the first metal pattern comprises:

a first conductive line extending in a first direction; and a second conductive line extending the first direction;

depositing a first via on a first portion of the first conductive line;

depositing a second via on a second portion of the second conductive line, wherein the first and second vias are formed simultaneously using area selective deposition into a single opening in a mask layer, and the first via is separated from the second via by a first edge-to-edge spacing;

depositing a second metal pattern on the first via and the second via, wherein the second metal pattern comprises:

a third conductive line contacting the first via; and a fourth conductive line contacting the second via, wherein the third conductive line is separated from the fourth conductive line by the first edge-to-edge spacing; and depositing a dielectric material between the first metal pattern and the second metal pattern after depositing the second metal pattern.

18. The method of claim 17, wherein depositing the second metal pattern comprises:

performing a self-assembled monolayer (SAM) passivation on non-growth regions of the integrated circuit device; and performing atomic layer deposition (ALD) on growth regions of the integrated circuit device.

19. The method of claim 18, wherein depositing the second metal pattern further comprises performing atomic layer etching (ALE) prior to performing the ALD.

20. The method of claim 17, where depositing the second metal pattern further comprises:

a plurality of metal-on-metal deposition processes; and a plurality of dielectric-on-dielectric deposition processes.

* * * * *